United States Patent
Kanno

(10) Patent No.: US 10,529,417 B2
(45) Date of Patent: Jan. 7, 2020

(54) STORAGE DEVICE THAT INVERTS BITS OF DATA WRITTEN INTO A NONVOLATILE MEMORY THEREOF

(71) Applicant: Toshiba Memory Corporation, Tokyo (JP)

(72) Inventor: Shinichi Kanno, Ota Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 30 days.

(21) Appl. No.: 15/441,031

(22) Filed: Feb. 23, 2017

(65) Prior Publication Data

US 2018/0076828 A1    Mar. 15, 2018

(30) Foreign Application Priority Data

Sep. 9, 2016   (JP) ................. 2016-176835

(51) Int. Cl.
| | |
|---|---|
| *H03M 13/05* | (2006.01) |
| *H03M 13/00* | (2006.01) |
| *G11C 11/56* | (2006.01) |
| *G11C 16/04* | (2006.01) |
| *G11C 7/10* | (2006.01) |

(Continued)

(52) U.S. Cl.
CPC ........ *G11C 11/5628* (2013.01); *G11C 7/1006* (2013.01); *G11C 16/10* (2013.01); *G11C 16/3495* (2013.01); *G11C 11/5642* (2013.01); *G11C 16/0483* (2013.01);
(Continued)

(58) Field of Classification Search
None
See application file for complete search history.

(56) References Cited

U.S. PATENT DOCUMENTS

| 7,796,426 B2 | 9/2010 | Tonomura et al. |
| 2009/0091991 A1* | 4/2009 | Cho .................... G11C 11/5628 |
| | | 365/189.16 |

(Continued)

FOREIGN PATENT DOCUMENTS

| JP | 4358299 B2 | 11/2009 |
| JP | 2011-508358 A | 3/2011 |
| JP | 2011-527159 A | 10/2011 |

OTHER PUBLICATIONS

Weingarten, Hanan, NAND Flash PHY Units for Advanced SSD Design, Flash Memory Summit, 2013, http://www.bswd.com/FMS13/FMS13-Weingarten.pdf, p. 13.*

(Continued)

*Primary Examiner* — Justin R Knapp
(74) *Attorney, Agent, or Firm* — Kim & Stewart LLP

(57) ABSTRACT

A storage device includes a nonvolatile memory and a controller. The controller is configured to generate coded data based on write data and an error correction code generated from the write data, determine whether or not to invert each bit of the coded data, based on a logical page position of the nonvolatile memory in which the write data are to be written and a value "0" or "1" of bits that are more populated in the coded data than bits having the other value of "1" and "0", invert each bit of the coded data upon determining to invert, and write the non-inverted or inverted coded data into the logical page position of the nonvolatile memory. The logical page position is one of logical page positions including a lower page and an upper page.

17 Claims, 28 Drawing Sheets

(51) Int. Cl.
  G11C 16/10 (2006.01)
  G11C 16/34 (2006.01)
  *H03M 13/11* (2006.01)
  *H03M 13/15* (2006.01)

(52) U.S. Cl.
  CPC ...... *H03M 13/1102* (2013.01); *H03M 13/152* (2013.01); *H03M 13/1515* (2013.01)

(56) References Cited

U.S. PATENT DOCUMENTS

| | | | | |
|---|---|---|---|---|
| 2009/0303789 | A1* | 12/2009 | Fernandes | G11C 11/5628 |
| | | | | 365/185.03 |
| 2010/0002504 | A1* | 1/2010 | Kim | G11C 7/1006 |
| | | | | 365/185.03 |
| 2010/0287427 | A1 | 11/2010 | Kim et al. | |
| 2011/0141815 | A1 | 6/2011 | Haratsch et al. | |
| 2012/0166716 | A1* | 6/2012 | Schuette | G11C 13/0004 |
| | | | | 711/103 |
| 2013/0124779 | A1* | 5/2013 | Kotzur | G11C 16/10 |
| | | | | 711/103 |
| 2014/0173380 | A1* | 6/2014 | Wu | G11C 16/06 |
| | | | | 714/764 |
| 2014/0379671 | A1* | 12/2014 | Barrus | G06F 11/1076 |
| | | | | 707/692 |
| 2015/0067436 | A1 | 3/2015 | Hu et al. | |
| 2015/0309872 | A1* | 10/2015 | Cai | G06F 11/1024 |
| | | | | 714/764 |
| 2016/0179620 | A1* | 6/2016 | Bazarsky | H03M 13/116 |
| | | | | 714/766 |
| 2017/0199784 | A1* | 7/2017 | Fu | G06F 11/1072 |
| 2017/0257121 | A1* | 9/2017 | Kwok | G06F 11/1076 |

OTHER PUBLICATIONS

Japanese Office Action dated Jul. 9, 2019, filed in counterpart Japanese Patent Application No. 2016-176835, 6 pages (with English translation).

* cited by examiner

FIG. 12

EFFECT IN MLC

WHEN NUMBER OF "1" BITS AND NUMBER OF "0" BITS ARE BIASED AS 6:4

AFTER IMPROVEMENT

| | LOWER PAGE "1" IS GREATER | UPPER PAGE "0" IS GREATER | PROBABILITY |
|---|---|---|---|
| C | 0.4 | 0.4 | 0.16 |
| B | 0.4 | 0.6 | 0.24 |
| A | 0.6 | 0.6 | 0.36 |
| Er | 0.6 | 0.4 | 0.24 |

BEFORE IMPROVEMENT

| | LOWER PAGE | UPPER PAGE | PROBABILITY |
|---|---|---|---|
| C | 0.4 | 0.6 | 0.24 |
| B | 0.4 | 0.4 | 0.16 |
| A | 0.6 | 0.4 | 0.24 |
| Er | 0.6 | 0.6 | 0.36 |

PROBABILITIES OF Er AND C ARE LESS THAN PROBABILITIES OF OTHER THRESHOLD VOLTAGE LEVELS (A AND B)

FIG. 13

EFFECT IN TLC

WHEN NUMBER OF "1" BITS AND NUMBER OF "0" BITS ARE BIASED AS 6:4

BEFORE IMPROVEMENT

|    | LOWER PAGE | MIDDLE PAGE | UPPER PAGE | PROBABILITY |
|----|------------|-------------|------------|-------------|
| G  | 0.6        | 0.6         | 0.4        | 0.144       |
| F  | 0.4        | 0.6         | 0.4        | 0.096       |
| E  | 0.4        | 0.6         | 0.6        | 0.144       |
| D  | 0.4        | 0.4         | 0.6        | 0.096       |
| C  | 0.4        | 0.4         | 0.4        | 0.064       |
| B  | 0.6        | 0.4         | 0.4        | 0.096       |
| A  | 0.6        | 0.4         | 0.6        | 0.144       |
| Er | 0.6        | 0.6         | 0.6        | 0.216       |

AFTER IMPROVEMENT

ENCODING RULE 1

|    | LOWER PAGE "0" IS GREATER | MIDDLE PAGE "0" IS GREATER | UPPER PAGE "1" IS GREATER | PROBABILITY |
|----|---------------------------|----------------------------|---------------------------|-------------|
| G  | 0.4                       | 0.4                        | 0.4                       | 0.064       |
| F  | 0.6                       | 0.4                        | 0.4                       | 0.096       |
| E  | 0.6                       | 0.4                        | 0.6                       | 0.144       |
| D  | 0.6                       | 0.6                        | 0.6                       | 0.216       |
| C  | 0.6                       | 0.6                        | 0.4                       | 0.144       |
| B  | 0.4                       | 0.6                        | 0.4                       | 0.096       |
| A  | 0.4                       | 0.6                        | 0.6                       | 0.144       |
| Er | 0.4                       | 0.4                        | 0.6                       | 0.096       |

ENCODING RULE 2

|    | LOWER PAGE "1" IS GREATER | MIDDLE PAGE "0" IS GREATER | UPPER PAGE "1" IS GREATER | PROBABILITY |
|----|---------------------------|----------------------------|---------------------------|-------------|
| G  | 0.6                       | 0.4                        | 0.4                       | 0.096       |
| F  | 0.4                       | 0.4                        | 0.4                       | 0.064       |
| E  | 0.4                       | 0.4                        | 0.6                       | 0.096       |
| D  | 0.4                       | 0.6                        | 0.6                       | 0.144       |
| C  | 0.4                       | 0.6                        | 0.4                       | 0.096       |
| B  | 0.6                       | 0.6                        | 0.4                       | 0.144       |
| A  | 0.6                       | 0.6                        | 0.6                       | 0.216       |
| Er | 0.6                       | 0.4                        | 0.6                       | 0.144       |

PROBABILITIES OF Er AND C ARE LESS THAN PROBABILITIES OF OTHER THRESHOLD VOLTAGE LEVELS (A TO F)

STORAGE DEVICE THAT INVERTS BITS OF DATA WRITTEN INTO A NONVOLATILE MEMORY THEREOF

CROSS-REFERENCE TO RELATED APPLICATION

This application is based upon and claims the benefit of priority from Japanese Patent Application No. 2016-176835, filed Sep. 9, 2016, the entire contents of which are incorporated herein by reference.

FIELD

Embodiments described herein relate generally to a technology for controlling a nonvolatile memory.

BACKGROUND

Today, a storage device including a nonvolatile memory is widely used. As one of the nonvolatile memory, a NAND-type solid state drive (SSD) is known. SSDs are used as main storages of various computing devices because of low power consumption and high-speed performance. For such memory systems, an encoding technology of encoding data to be written using data patterns is developed to reduce exhaustion of memory cells.

However, according to the encoding technology, it would be necessary to attach information indicating content of the encoding as supplementary information to each user data. As the amount of the supplementary information increases, the amount of user data that can be written on each page of a nonvolatile memory decreases.

DESCRIPTION OF THE DRAWINGS

FIG. 12 illustrates probability of each threshold voltage distribution before and after application of endurance code encoding in an MLC flash memory.

FIG. 13 illustrates probability of each threshold voltage distribution before and after application of endurance code encoding in a TLC flash memory.

DETAILED DESCRIPTION

An embodiment provides a memory system and a control method capable of reducing supplementary information for encoding.

According to an embodiment, a storage device includes a nonvolatile memory and a controller. The controller is configured to generate coded data based on write data and an error correction code generated from the write data, determine whether or not to invert each bit of the coded data, based on a logical page position of the nonvolatile memory in which the write data are to be written and a value "0" or "1" of bits that are more populated in the coded data than bits having the other value of "1" and "0", invert each bit of the coded data upon determining to invert, and write the non-inverted or inverted coded data into the logical page position of the nonvolatile memory. The logical page position is one of logical page positions including a lower page and an upper page.

Hereinafter, embodiments will be described with reference to the drawings.

Figure 1:
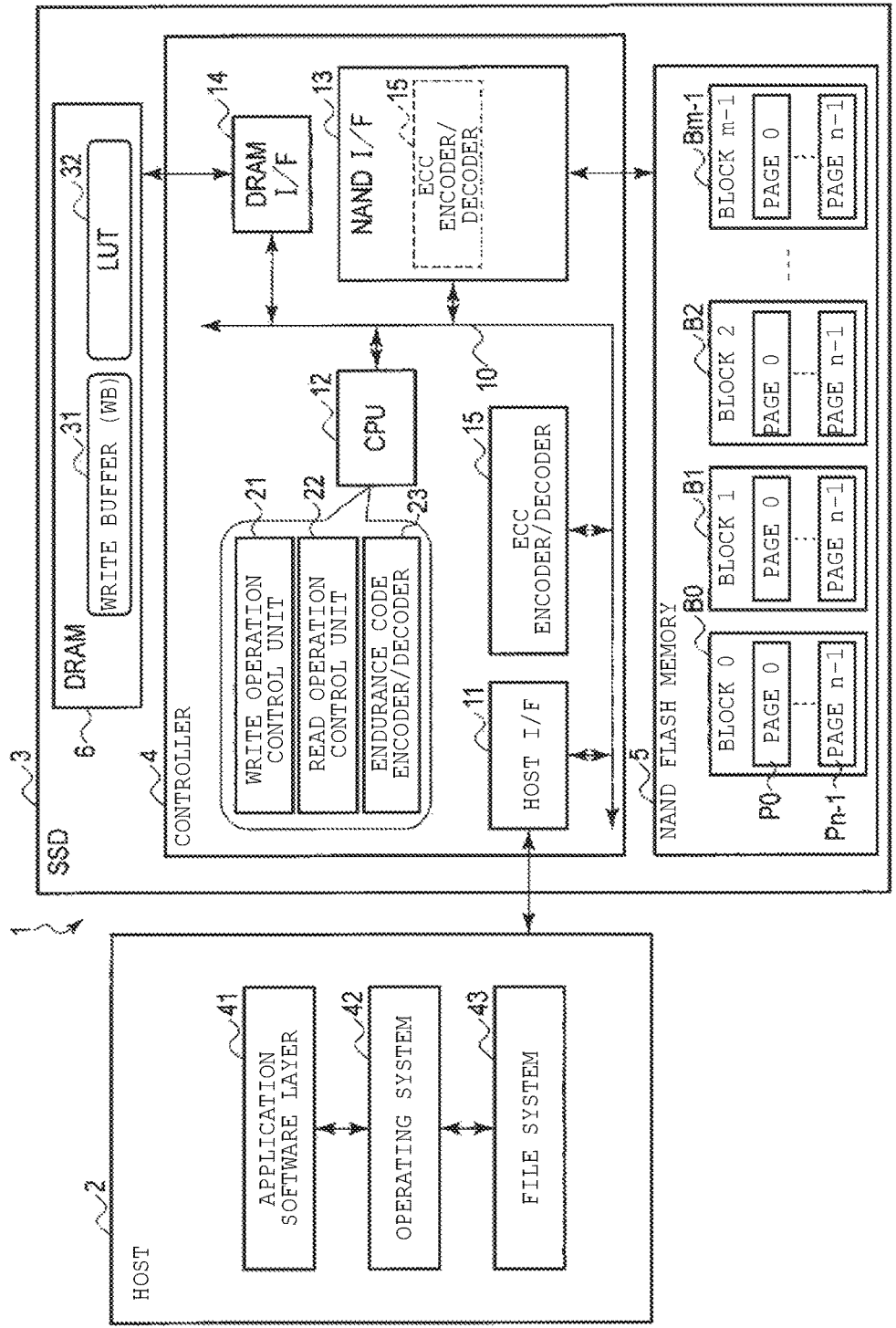
FIG. 1 is a block diagram of a memory system according to an embodiment.

First, a configuration of an information processing system 1 including a memory system according to an embodiment will be described with reference to FIG. 1.

The memory system is a semiconductor storage device configured to write data on a nonvolatile memory thereof and read data from the nonvolatile memory. For example, the memory system is a NAND-type solid state drive (SSD) 3.

The information processing system 1 includes a host (host device) 2 and the SSD 3. The host 2 is an information processing device such as a server or a personal computer.

The SSD 3 can be used as a main storage of the information processing device that functions as the host 2. The SSD 3 may be included in the information processing device or may be connected to the information processing device via a cable or a network.

As an interface that connects the host 2 and the SSD 3, an SCSI, a serial attached SCSI (SAS), an ATA, a serial ATA (SATA), a PCI express (PCIe), Ethernet®, a fibre channel, or the like can be used.

The SSD 3 includes a controller 4 and a nonvolatile memory (NAND flash memory) 5. The SSD 3 may further include a DRAM 6. A configuration of the NAND flash memory 5 is not limited, but the NAND flash memory 5 may include a plurality of NAND flash memory chips. The NAND flash memory 5 is configured to store data of 2 or more bits per memory cell. For example, the NAND flash memory 5 may be a multi-level cell (MLC) flash memory or may be a triple-level cell (TLC) flash memory.

The NAND flash memory 5 includes a memory cell array. The memory cell array includes a plurality of NAND blocks (blocks) B0 to Bm−1. One block functions as an erasing unit. The block is referred to as a "physical block" or an "erasure block" in some cases.

Each of the blocks B0 to Bm−1 includes a plurality of pages (physical pages). That is, each of the blocks B0 to Bm−1 includes pages P0 to Pn−1. In the NAND flash memory 5, data reading and data writing are executed in units of a page. Data erasing is executed in units of a block.

The controller 4 is electrically connected to the NAND flash memory 5, which is a nonvolatile memory, via the NAND interface 13 such as Toggle or ONFI. The controller 4 can function as flash translation layer (FTL) configured to execute data management of the NAND flash memory 5 and execute block management of the NAND flash memory 5.

The data management includes (1) management of mapping information indicating a correspondence between a logic block address (LBA) and a physical address and (2) a process of hiding reading/writing in units of a page and an erasing operation in units of a block. The management of mapping between the LBA and the physical address is executed using a lookup table (LUT) 32 that functions as a logic and physical address conversion table. The lookup table (LUT) 32 is used to manage mapping between the LBA and the physical address in a predetermined management size unit. A considerable number of write commands from the host 2 requests to write data of 4 K bytes. Accordingly, the lookup table (LUT) 32 may be used to manage mapping between the LBA and the physical address, for example, in a unit of 4 K bytes. A physical address corresponding to a certain LBA indicates a physical storage position in the NAND flash memory 5 in which data of the LBA is written. The physical address includes a physical block address and a physical page address. Physical page addresses are allocated to all of the pages and physical block addresses are allocated to all of the blocks.

Writing of data in a page can be executed only once per erasure cycle. Therefore, the controller 4 maps writing (overwriting) on the LBA to another page on the NAND flash memory 5. That is, the controller 4 writes data (write data) designated by a write command received from the host 2 on a subsequent usable page in a block that is currently allocated as a write destination block irrespective of the LBA of the data. Then, the controller 4 updates the lookup table (LUT) 32 and associates the LBA with a physical address of the page in which the data are actually written. When there is no usable page in the write destination block, a new block can be allocated as a write destination block.

The block management includes management of a bad block, wear leveling, and garbage collection.

The host 2 transmits a read command and a write command to the SSD 3. The read command is a command for requesting the SSD 3 to read data. The read command includes an LBA (start LBA) of data to be read and a transmission length of the data to be read. The write command is a command for requesting the SSD 3 to write data. The write command includes an LBA (start LBA) of write data (that is, data to be written) and a transmission length of the write data.

Next, the configuration of the controller 4 will be described.

The controller 4 includes a host interface 11, a CPU 12, a NAND interface 13, a DRAM interface 14, and an error correction code (ECC) encoder/decoder 15. The CPU 12, the NAND interface 13, the DRAM interface 14, and the ECC encoder/decoder 15 are connected to each other via a bus 10.

The host interface 11 receives various commands (a write command, a read command, an erase command, an unmap command, and the like) from the host 2.

The CPU 12 is a processor configured to control the host interface 11, the NAND interface 13, the DRAM interface 14, and the ECC encoder/decoder 15. The CPU 12 executes command processing or the like for processing various commands from the host 2 in addition to processing of the above-described FTL.

For example, when the controller 4 receives a write command from the host 2, the controller 4 executes the following write operation of writing write data designated by the write command in the NAND flash memory 5 under the control of the CPU 12.

The controller 4 writes the write data at a physical storage position (usable page) of a current write destination block, updates the lookup table (LUT) 32, and maps the physical address of the physical storage position to an LBA (start LBA) included in the write command.

The FTL processing and the command processing may be controlled by firmware executed by the CPU 12. The firmware causes to the CPU 12 to function as the write operation control unit 21, the read operation control unit 22, and the endurance code encoder/decoder 23.

The write operation control unit 21 stores write data received from the host 2 in a write buffer (WB) 31. Then, the write operation control unit 21 writes data in the write buffer (WB) 31 on the NAND flash memory 5 in the page unit. In this case, in cooperation with the NAND interface 13, the write operation control unit 21 writes a plurality of pages of the data at a plurality of page locations at which a plurality of pieces of data are allocated to the same physical pages of the NAND flash memory 5 by data of 2 or more bits per memory cell. The physical page means a memory cell group connected to the same word lines.

The plurality of pages of the data includes at least lower page data and upper page data. A plurality of page locations allocated to one physical page includes at least a lower page and an upper page.

Alternatively, the plurality of pages of data may include lower page data, one or more pieces of middle page data, and upper page data. The plurality of page locations may also include a lower page, one or more middle pages, and an upper page.

When the NAND flash memory 5 is configured as a multi-level cell (MLC) flash memory capable of storing data of 2 bits per memory cell, two page locations, that is, a lower page and an upper page, are allocated to one physical page (a memory cell group connected to the same word line). To write the data of 2 bits on each of the memory cells configuring one physical page (a software program), two pages of the data, that is, lower page data and upper page data, are written on a lower page and an upper page of the physical page, respectively.

When the NAND flash memory 5 is configured as a triple-level cell (TLC) flash memory capable of storing data of 3 bits per memory cell, three page locations, that is, a lower page, a middle page, and an upper page, are allocated to one physical page (a memory cell group connected to the same word line). To write the data of 3 bits on each of the memory cells configuring one physical page (a software program), three pages of the data, that is, lower page data, middle page data, and upper page data, are written on a lower page, a middle page, and an upper page of the physical page, respectively.

The number of page locations allocated to one physical page (a memory cell group connected to the same word line) may be 4 or more. In this case, a lower page, two or more middle pages, an upper page are allocated to one physical page.

In cooperation with the NAND interface 13, the read operation control unit 22 reads data from a page (page location) of the NAND flash memory 5 designated by a read request from the host 2.

The endurance code encoder/decoder 23 executes encoding and decoding processes to improve durability (endurance) of the NAND flash memory 5 and reliability of data. During the encoding process (endurance code encoding), page data to be written, that is, write data with a size equivalent to one page, are encoded using codes capable of reducing exhaustion of the memory cell and decreasing a bit error rate (also referred to as endurance codes).

In the present embodiment, the encoding process is carried out to reduce the amount of supplementary information (redundant information) included in the encoded data as much as possible and to obtain a sufficiently rapid writing speed.

That is, in the data write operation, the ECC encoder/decoder 15 first generates an error correction code (ECC) for the write data with the size equivalent to one page (lower page data or upper page data in the MLC, and lower page data, middle page data, or upper page data in the TLC). The endurance code encoder/decoder 23 determines which of "0" or "1" are included more in a data series that includes the write data (page data to be written) and the ECC. Based on the determination result and a page location on which the write data are to be written, the endurance code encoder/decoder 23 generates encoded data (a pair of write data and an ECC or a pair of inverted write data in which each bit of the write data is inverted and an inverted ECC in which each bit of the ECC is inverted). The encoded data are written at the page location. For example, when the write data are lower page data that are to be written on a lower page in MLC cells, the write data are encoded such that the number of bits of "1" included in the encoded data increases. As a result, encoded data (a pair of write data and an ECC or a pair of inverted write data in which each bit of the write data is inverted and an inverted ECC in which each bit of the ECC is inverted) are generated. In contrast, when the write data are upper page data that are to be written on an upper page, the write data are encoded such that the number of bits of "0" included in the encoded data increases. As a result, encoded data (a pair of write data and an ECC or a pair of inverted write data in which each bit of the write data is inverted and an inverted ECC in which each bit of the ECC is inverted) are generated.

During the data read operation, the data and the ECC are read from a reading target page location. Then, the ECC encoder/decoder 15 executes an error correction decoding process (ECC decoding process) to correct an error of read data using the read data and the read ECC.

When a decoding failure occurs in the ECC decoding process, the endurance code encoder/decoder 23 interprets the read data and an ECC as the inverted data of the original write data and the inverted ECC of the original ECC. This is because when the ECC decoding process is executed using the read ECC and the read data despite the writing of the inverted data and the inverted ECC, the ECC decoding process may not be correctly executed. For that reason, the number of errors exceeding an error correction capability of the ECC is detected through the ECC decoding process, thereby causing a decoding failure (also referred to as a "decoding error"). When the decoding failure occurs in the ECC decoding process, the endurance code encoder/decoder 23 generates the inverted data in which each bit of the read data is inverted and the inverted error correction code in which each bit of the read ECC is inverted. Then, the endurance code encoder/decoder 23 controls the ECC encoder/decoder 15 such that the ECC decoding process is executed again using the inverted data and the inverted error correction code.

In this way, in the present embodiment, it is determined which of "0" bits or "1" bits are included more in a data series including write data (page data) that have a size equivalent to one page and the ECC for the write data. Then, based on the determination result and the target page location at which the write data are to be written, one of the pair of write data and an ECC and the pair of inverted data in which each bit of the write data is inverted and an inverted ECC in which each bit of the ECC is inverted is written at the target page location. Accordingly, both of the write data and the ECC can be encoded using codes capable of reducing exhaustion of the memory cell and decreasing a bit error rate. Then, whether to invert the encoded data read from the NAND flash memory 5 is determined using a result of the ECC decoding process. For that reason, in the present embodiment, it is not necessary to add independent bits (supplementary information) indicating inversion or non-inversion of the data series including the write data and the ECC to the encoded data.

In general, the size of the ECC to be written in a page is considerably smaller than the size of the write data to be written in the page. For that reason, the encoded data may be generated through inversion or non-inversion of only the write data instead of through inversion or non-inversion of a combination of the write data and the ECC. The original write data may be written at a target page location along with the ECC for the original write data.

In this case, in the data write operation, the ECC encoder/decoder 15 first generates the ECC for the write data with a size equivalent to one page. The endurance code encoder/decoder 23 determines which of "0" bits or "1" bits are included more in the write data. Based on the determination result and a target page location at which the write data are to be written, the endurance code encoder/decoder 23 generates the encoded data (the write data or the inverted write data in which each bit of the write data is inverted). The encoded data and the ECC for the original write data are written on the target page location.

During the data read operation, the data and the ECC are read from a reading target page location. Then, the ECC encoder/decoder 15 executes an error correction decoding process (ECC decoding process) to correct an error of the read data using the red data and the read ECC.

When a decoding failure occurs in the ECC decoding process, the endurance code encoder/decoder 23 interprets the read data as the inverted data of the original write data. This is because when the ECC decoding process is executed using the read ECC and the read data despite writing of the inverted data, the ECC decoding process may not be correctly executed, and therefore the number of errors exceeding an error correction capability of the ECC is detected through the ECC decoding process, thereby causing a decoding failure (also referred to as a "decoding error"). Then, the endurance code encoder/decoder 23 executes the ECC decoding process again using the inverted data in which each bit of the read data is inverted and the read ECC. Thus, it is possible to correctly execute the ECC decoding process on the read data and return the data decoded through the ECC decoding process to the host 2.

Next, other components of the controller 4 will be described.

The NAND interface 13 is a NAND controller configured to control the NAND flash memory 5 under the control of the CPU 12. The above-described ECC encoder/decoder 15 may be contained in the NAND interface 13.

The DRAM interface 14 is a DRAM controller configured to control the DRAM 6 under the control of the CPU 12.

A part of the storage region of the DRAM 6 may be used as the write buffer (WB) 31 to temporarily store data to be written in the NAND flash memory 5. The storage region of the DRAM 6 may be used to store the above-described lookup table (LUT) 32.

Next, the configuration of the host 2 will be described.

The host 2 is an information processing device that executes various software programs. A software program executed by the information processing device includes an application software layer 41, an operating system (OS) 42, and a file system 43.

As known generally, the operating system (OS) 42 is software that is executed to manage the host 2 and control hardware in the host 2 such that applications can use the hardware and the SSD 3. The file system 43 is used to control file management (generating, storing, updating, erasing, and the like).

Various application software threads run on the application software layer 41. Examples of the application software threads include client software, database software, and a virtual machine.

When the application software layer 41 necessarily transmits a request such as a read request or a write request to the SSD 3, the application software layer 41 transmits the request to the OS 42. The OS 42 transmits the request to the file system 43. The file system 43 translates the request into a command (a read command, a write command, or the like). The file system 43 transmits the command to the SSD 3. When a response is received from the SSD 3, the file system 43 transmits the response to the OS 42. The OS 42 transmits the response to the application software layer 41.

Figure 2:
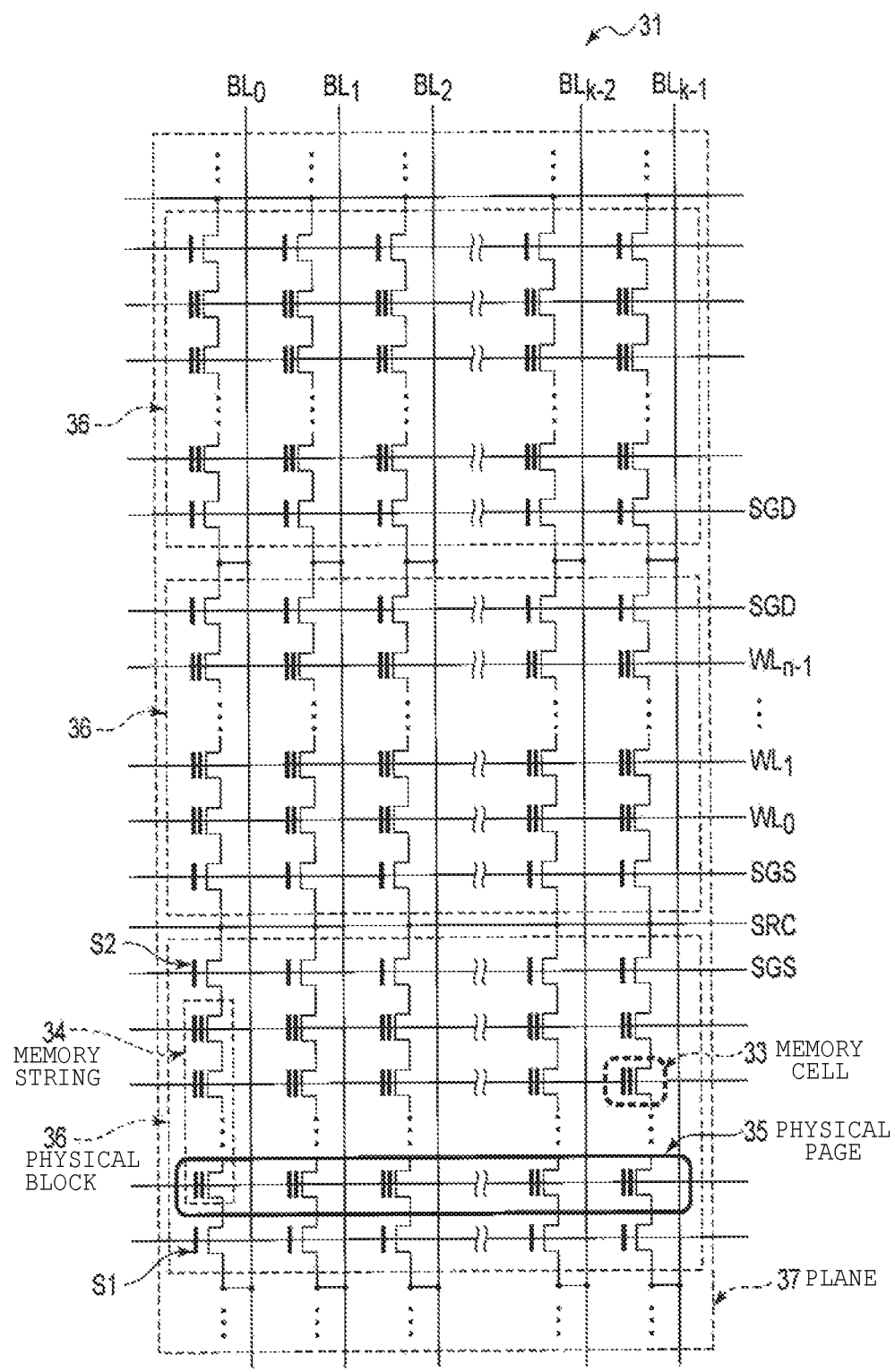
FIG. 2 is a circuit diagram of a memory cell array in a nonvolatile memory of the memory system according to the embodiment.

FIG. 2 illustrates an example of the configuration of the memory cell array in the NAND flash memory 5.

The memory cell array includes a plurality of physical blocks 36. Each physical block 36 includes a plurality of NAND strings. Each NAND string includes a memory string 34 and select gates S1 and S2 connected to both ends of the memory string 34. The memory string 34 also includes a plurality of memory cells 33 connected in series.

Each memory cell 33 is configured with a memory cell transistor. The memory cell transistor is, for example, a metal oxide semiconductor field effect transistor (MOSFET) that has a stacked gate structure formed on a semiconductor substrate. The stacked gate structure includes a floating gate electrode and a control gate electrode. A threshold voltage of the memory cell transistor varies according to the amount of charges stored in the floating gate electrode. The memory cell transistor in which data with a certain specific value are stored has a threshold voltage corresponding to the specific value.

The select gate S1 is connected to a bit line BL31 and the select gate S2 is connected to a source line SRC. Control gates of the memory cell group 33 disposed at the same column are commonly connected to the same word line WL. Gates of the select gate group S1 are commonly connected to a select line SGD and gates of the select gate group S2 are commonly connected to the select line SGS.

The memory cell array includes one or more planes 37. The plane 37 includes a plurality of physical blocks 36. Each of the physical blocks 36 includes a plurality of NAND strings. Data are erased in units of one physical block 36.

The plurality of memory cells 33 connected to one word line WL form one physical page 35. Writing and reading of data are executed in units of one physical page 35. In an MLC flash memory that stores data of 2 bits per memory cell, one physical page 35 are equivalent to two pages (a lower page and an upper page) and a page address is allocated to each of the two pages (the lower page and the upper page). In a TLC flash memory that stores data of 3 bits per memory cell, the physical page 35 is equivalent to three pages (a lower page, a middle page, and an upper page) and a page address is allocated to each of the three pages (the lower page, the middle page, and the upper page).

Figure 3:
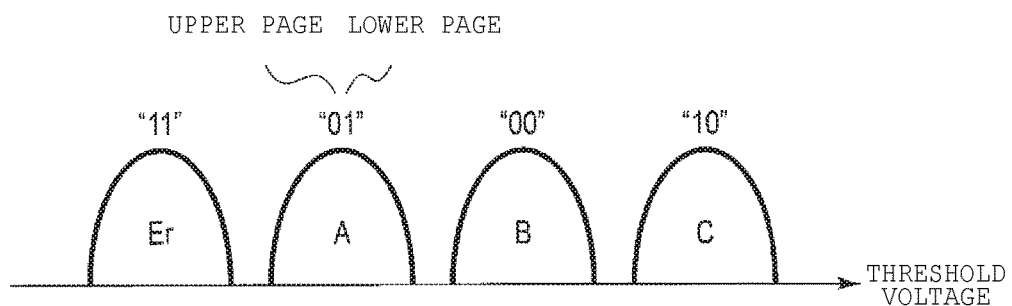
FIG. 3 illustrates a threshold voltage distribution in a multi-level cell (MLC) flash memory that stores 2-bit data.

FIG. 3 illustrates threshold voltage distributions of the memory cell array in an MLC flash memory.

Each memory cell is set to one of four threshold voltage distributions ("Er", "A", "B", and "C") corresponding to a 2-bit code ("11", "01", "00", and "10"). The threshold voltage distribution "Er" is a threshold voltage distribution corresponding to an erased state. The threshold voltage distributions and "C" are threshold voltage distributions corresponding to states in which data are written (programmed). A threshold voltage level of the threshold voltage distribution "Er" is the lowest and a threshold voltage level of the threshold voltage distribution "C" is the highest. In a data write operation to a certain physical page, lower page data are first written on a lower page of the physical page. Thus, each memory cell in the physical page is set to one of the threshold voltage distribution "Er" and the threshold voltage distribution "B" or one of the threshold voltage distribution "Er" and a predetermined intermediate threshold voltage distribution based on the value of a corresponding lower page bit. Then, the upper page data are written on the upper page of the physical page. As a result, each memory cell in the physical page is set to one of the threshold voltage distributions "Er", "A", "B", and "C" based on the value of a corresponding lower page bit and the value of a corresponding upper page bit.

In a data read operation, when a page address for designating a lower page of a certain physical page is input, lower page data written on the lower page are read. When a page address for designating an upper page of a certain physical page is input, upper page data written on the upper page are read.

Figure 4:
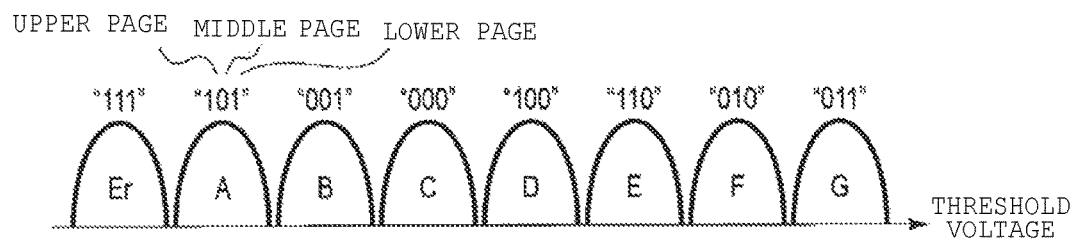
FIG. 4 illustrates a threshold voltage distribution of a triple-level cell (TLC) flash memory that stores 3-bit data.

FIG. 4 illustrates a threshold voltage distribution of the memory cell array in a TLC flash memory.

Each memory cell is set to one of eight threshold voltage distributions ("Er", "A.", "B", "C", "D", "E", "F", and "G") corresponding to a 3-bit code ("111", "101", "001" "000", "100", "110", "010", and "011").

In a data write operation to a certain physical page, writing of lower page data, writing of middle page data, and writing of upper page data are executed.

In a data read operation, when a page address for designating a lower page of a certain physical page is input, lower page data written on the lower page are read. When a page address for designating a middle page of the physical page is input, middle page data written on the middle page are read. When a page address for designating an upper page of a certain physical page is input, upper page data written on the upper page are read.

Figure 5:
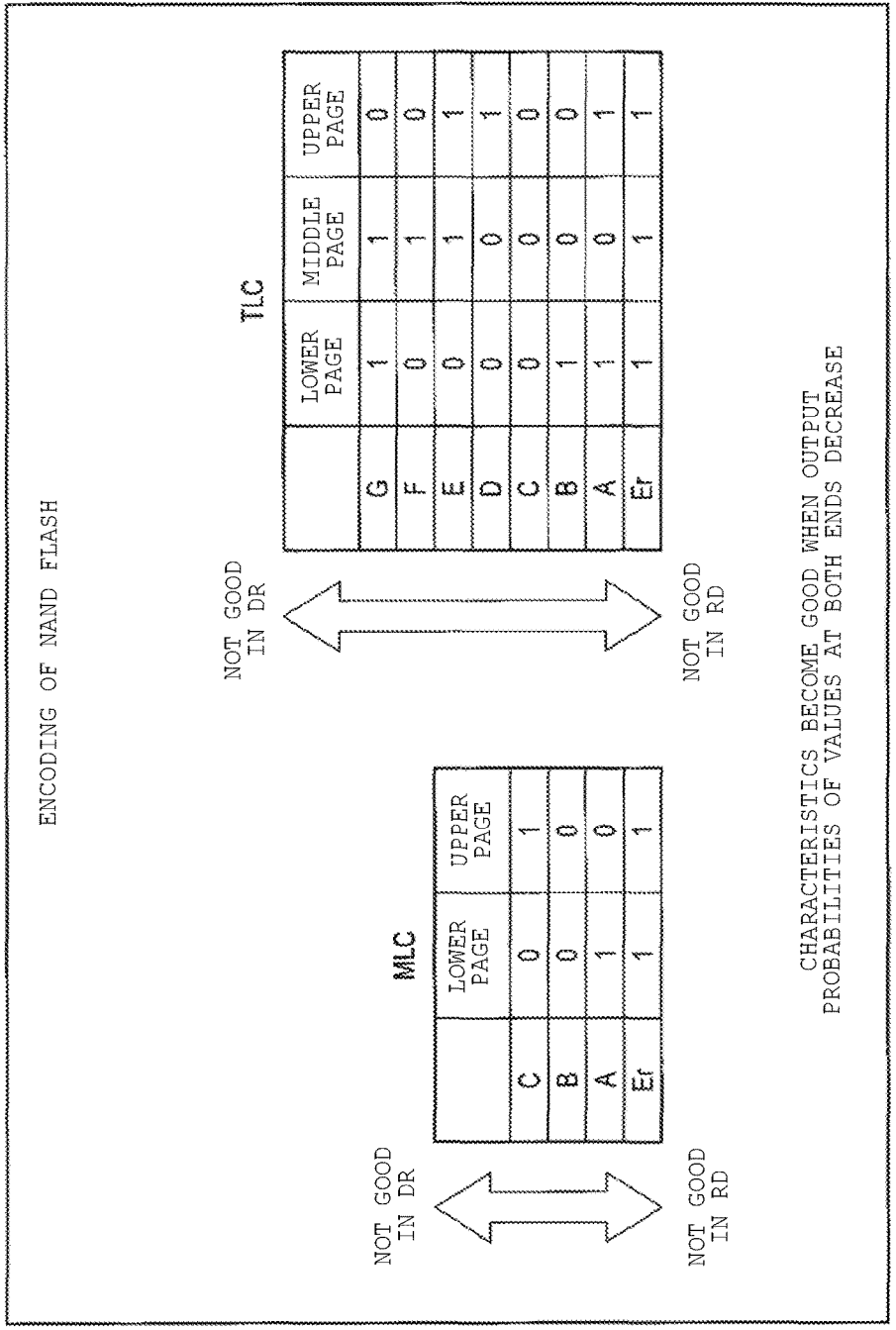
FIG. 5 illustrates allocation of "1"/"0" of lower and upper page bits for the MLC flash memory, and allocation of "1"/"0" of upper, middle, and lower page bits for a TLC flash memory.

FIG. 5 illustrates mapping of "1"/"0" of lower page bits to 4 threshold voltage distributions of an MLC flash memory, mapping of "1"/"0" of upper page bits to the 4 threshold voltage distributions, mapping of "1"/"0" of lower page bits to 8 threshold voltage distributions of a TLC flash memory, mapping of "1"/"0" of middle page bits to the 8 threshold voltage distributions, and mapping of "1"/"0" of upper page bits to the 8 threshold voltage distributions.

Either the MLC flash memory or the TLC flash memory, a code of all "1" s are allocated to the threshold voltage distribution "Er" in an erased state. When an individual page location (a lower page or an upper page in the MLC flash memory or a lower page, a middle page, or an upper page in the TLC flash memory) is interested, "1"/"0" may be mapped to four or eight threshold voltage distributions so that each of "1" and "0" is continued at least twice.

In the flash memory, a data state (a high threshold voltage level) in which the amount of charge stored in the memory cell is large deteriorates the memory cell more than a data state (a low threshold voltage level) in which the amount of charge stored in the memory cell is small. In the flash memory, due to a reduction in the amount of charge stored in the memory cell over time, a data retention (DR) error in which the threshold voltage level of the memory cell deteriorates over time may occur. As the threshold voltage level of the programmed memory cell increases, the data retention error increases. For that reason, in the MLC flash memory, the data retention error is more likely to occur in the memory cell of the threshold voltage distribution "C".

In the flash memory, a read disturbance (RD) error in which the threshold voltage level of a memory cell (in particular, an unselected memory cell) increases due to a data read operation may occur. For that reason, in the memory cell of the threshold voltage distribution "Er", the read disturbance error is more likely to occur.

For that reason, in the MLC flash memory, in order to decrease exhaustion of the memory cell and reduce a bit error rate, it is desirable to decrease the number of bits corresponding to both ends (a 2-bit code corresponding to "Er" and a 2-bit code corresponding to "C") and to increase the number of bits corresponding to intermediate values (a 2-bit code corresponding to "B" and a 2-bit code corresponding to "A").

In the MLC flash memory, the values of the lower page bits allocated to the four threshold voltage distributions "Er", "A", "B", and "C" are, for example, "1", "1", "0", and "0", respectively. The values of the upper page bits allocated to the four threshold voltage distributions "Er", "A", "B", and "C" are, for example, "1", "0", "0", and "1", respectively.

In the present embodiment, in order to decrease the number of bits corresponding to the "C" and "Er", write data (for example, both of the write data and the ECC or only write data) are encoded so as to increase the number of "1"s when the write data are lower page data. Also, the write data (for example, both of the write data and the ECC or only the write data) are encoded so as to increase the number of "0"s when the write data are upper page data. In other words, in the MLC flash memory, an encoding rule is set to increase the number of "1"s of the lower page data and the number of "0"s of the upper page data.

In the TLC flash memory, the values of lower page bits allocated to the eight threshold voltage distributions "Er", "A", "B", "C", "D", "E", "F", and "G" are, for example, "1", "1", "1", "0", "0", "0", "0", and "1", respectively. The values of the middle page bits allocated to the eight threshold voltage distributions "Er", "A", "B", "C", "D", "E", "F", and "G" are, for example, "1", "0", "0", "0", "0", "1", "1", and "1", respectively. The values of the upper page bits allocated to the eight threshold voltage distributions "Er", "A", "B", "C", "D", "E", "F", and "G" are, for example, "1", "1", "0", "0", "1", "1", "0", and "0", respectively.

In the present embodiment, in order to decrease the number of bits corresponding to "G" and "Er", one of two kinds of encoding rules (encoding rules #1 and #2) for the TLC flash memory is employed.

According to the encoding rule #1, when the write data are the lower page data, the write data (for example, both of the write data and the ECC or only the write data) are encoded so as to increase the number of "0"s. When the write data are the middle page data, the write data (for example, both of the write data and the ECC or only the write data) are encoded so as to increase the number of "0"s. When the write data are the upper page data, the write data (for example, both of the write data and the ECC or only the write data) are encoded so as to increase the number of "1"s. In other words, according to the encoding rule #1 for the TLC flash memory, the encoding is carried out so as to increase the number of "0"s of the lower page data, increase the number of "0"s of the middle page data, and increase the number of "1" of the upper page data.

Encoding rule #2 is the same as encoding rule #1 except that the encoding is carried out so as to increase the number of "1"s of the lower page data. In other words, according to the encoding rule #2 for the TLC flash memory, the encoding is carried out so as to increase the number of "1"s of the lower page data, increase the number of "0" of the middle page data, and increase the number of "1"s of the upper page data.

Figure 6:
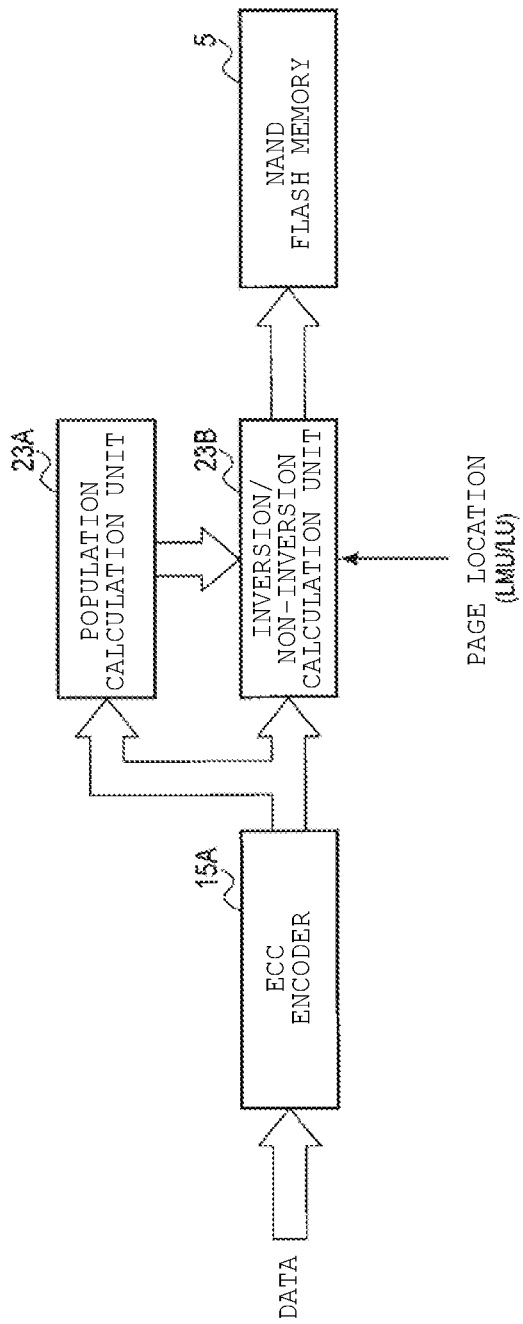
FIG. 6 is a block diagram of an encoder in the memory system according to the embodiment.

FIG. 6 illustrates an example of the configuration of an endurance code encoder in the endurance code encoder/decoder 23.

The endurance code encoder includes a population calculation unit 23A and an inversion/non-inversion calculation unit 23B. The population calculation unit 23A executes calculation to count population of "1" (the number of "1" bits) included in a data series of the write data with a size equivalent to one page and the ECC for the write data, and then determines which of "0" bits or "1" bits are included more in the data series. Alternatively, the population calculation unit 23A may be configured to count population of "0" (the number of "0" bits) included in the data series.

The inversion/non-inversion calculation unit 23B outputs, as encoded data, one of a pair of the write data and the ECC and a pair of inverted write data in which each bit of the write data is inverted and an inverted ECC in which each bit of the ECC is inverted by executing inversion or non-inversion of each bit of the data series (the write data and the ECC).

The inversion or non-inversion operation of the data series is controlled based on a calculation result (that is, a determination result indicating which of "0" bits or "1" bits are included more) of the population calculation unit 23A and a target page location at which the write data are to be written (the lower page/the upper page in the MLC flash memory or the lower page/the middle page/the upper page in the TLC flash memory).

During the data write operation, the write data are first transmitted to an ECC encoder 15A. The ECC encoder 15A encodes the write data using ECC encoding such as a BCH code, a Reed-Solomon code, or an LDPC code, and then generates an ECC for the write data. The ECC is a code for detecting and correcting an error in the write data.

In the encoding process of generating the ECC, the write data may be segmented into a plurality of data portions and a plurality of ECC portions corresponding to the plurality of data portions may be generated. In some embodiments, not only the ECC for the write data but an error detection code (for example, CRC) for detecting an error in the write data may also be generated. The error detection code may be a code capable of detecting more errors than the ECC. The ECC encoder 15A may encode an information symbol including the write data and the error detection code and then generates the ECC for the information symbol.

After the ECC encoder 15A generates the ECC for the write data, the write data and the ECC are transmitted to each of the population calculation unit 23A and the inversion/non-inversion calculation unit 23B. Then, it is determined which of "0" bits or "1" bits are included more in the data series including the write data and the ECC. Then, based on the determination result and the target page location, all the bits of the data series including the write data and the ECC are inverted or non-inverted. As a result, the encoded data (the pair of the write data and the ECC or the pair of the inverted write data and the inverted ECC) are generated. The encode data are written on the target page location of the NAND flash memory 5.

Alternatively, the population calculation unit 23A may execute calculation to count population of "1" (the number of "1" bits) included only in the write data with a size equivalent to one page and determine which of "0" bits or "1" bits are included more in the write data. The inversion/non-inversion calculation unit 23B may execute inversion or non-inversion of each bit of the write data and output one of the original write data and the inverted write data as the encoded data. The inversion or non-inversion operation for the write data is controlled based on a calculation result of the population calculation unit 23A (that is, the determination result indicating which of "0" bits or "1" bits are included more) and the target page location at which the write data are to be written (the lower page/the upper page in the MLC flash memory or the lower page/the middle page/the upper page in the TLC flash memory). That is, the write data are first transmitted to the ECC encoder 15A. Then, the ECC encoder 15A encodes the write data and generates the ECC for the write data. After the ECC encoder 15A generates the ECC for the write data, the write data are transmitted to each of the population calculation unit 23A and the inversion/non-inversion calculation unit 23B. Then, it is determined which of "0" bits or "1" bits are included more in the write data. Then, based on the determination result and the target page location, all the bits of the write data are inverted or non-inverted. As a result, the encoded data corresponding to the write data are generated. The encode data are written in the target page location of the NAND flash memory 5 along with the ECC corresponding to the original write data.

Figure 7:
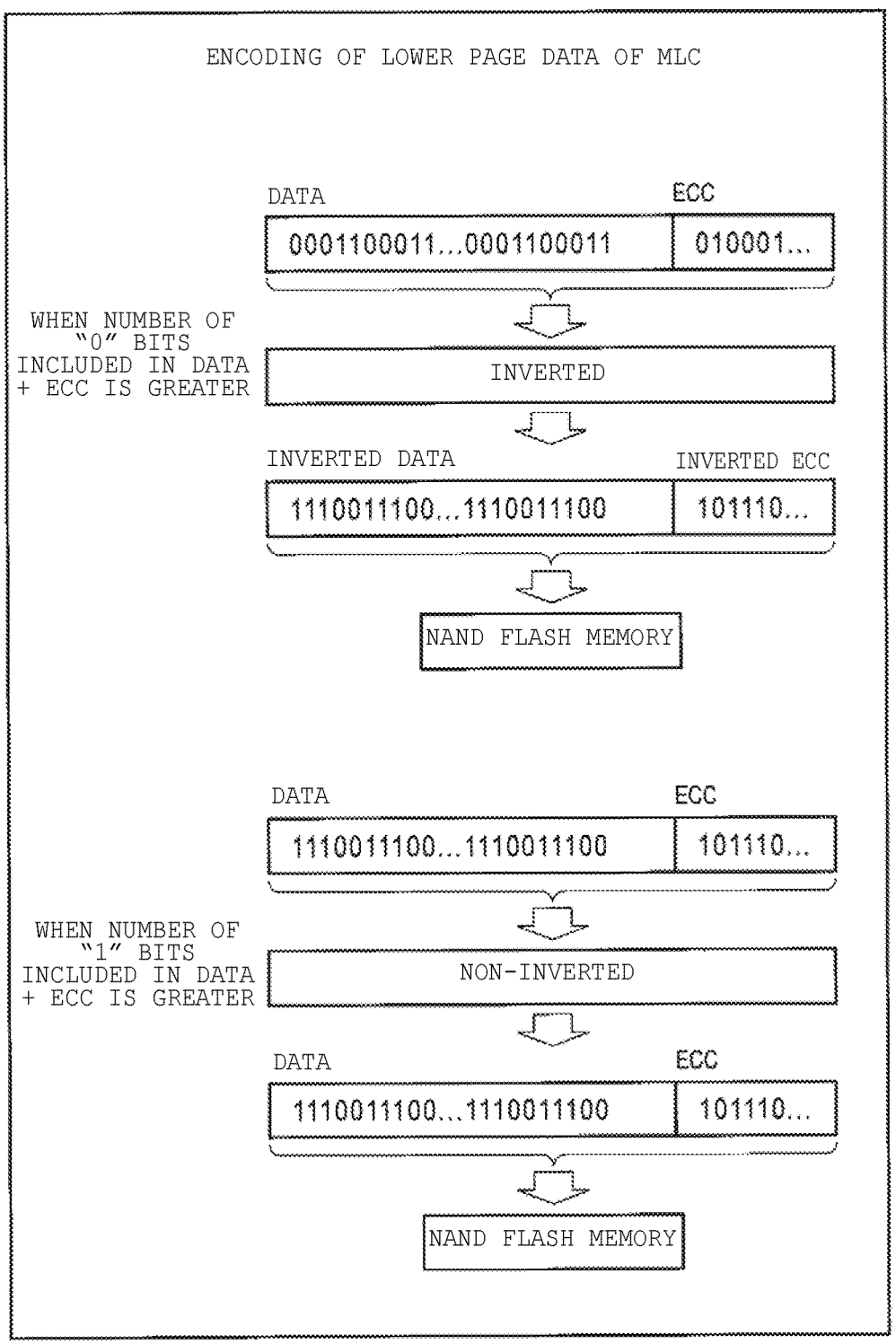
FIG. 7 illustrates an operation of encoding write data to be written on a lower page of an MLC flash memory and an ECC for the write data.

FIG. 7 illustrates an operation of encoding the write data (lower page data) to be written on the lower page of the MLC flash memory and the ECC for the write data.

Through the operation, the data series including the write data and the ECC is encoded so as to increase the number of "1"s.

As illustrated in the upper part of FIG. 7, when the number of "0" bits" included in the data series including the write data and the ECC is greater than the number of "1" bits included in the data series, a bit inversion operation of inverting all bits of the data series is executed. Through the bit inversion operation, "1" bits in the data series are converted into "0" bits and "0" bits in the data series are converted into "1" bits. As a result, the inverted data (the inverted write data and the inverted ECC) of the data series are generated as encoded data. Then, the encoded data are written on a target page location (here, a lower page of a certain physical page) of the NAND flash memory 5.

In contrast, as illustrated in the lower part of FIG. 7, when the number of "1" bits of included in the data series including the write data and the ECC is greater than the number of "0" bits included in the data series, the bit inversion operation is not executed. As a result, the original data series (the original write data and the original ECC) is generated as encoded data. Then, the encoded data are written on a target page location (here, a lower page of a certain physical page) of the NAND flash memory 5.

Figure 8:
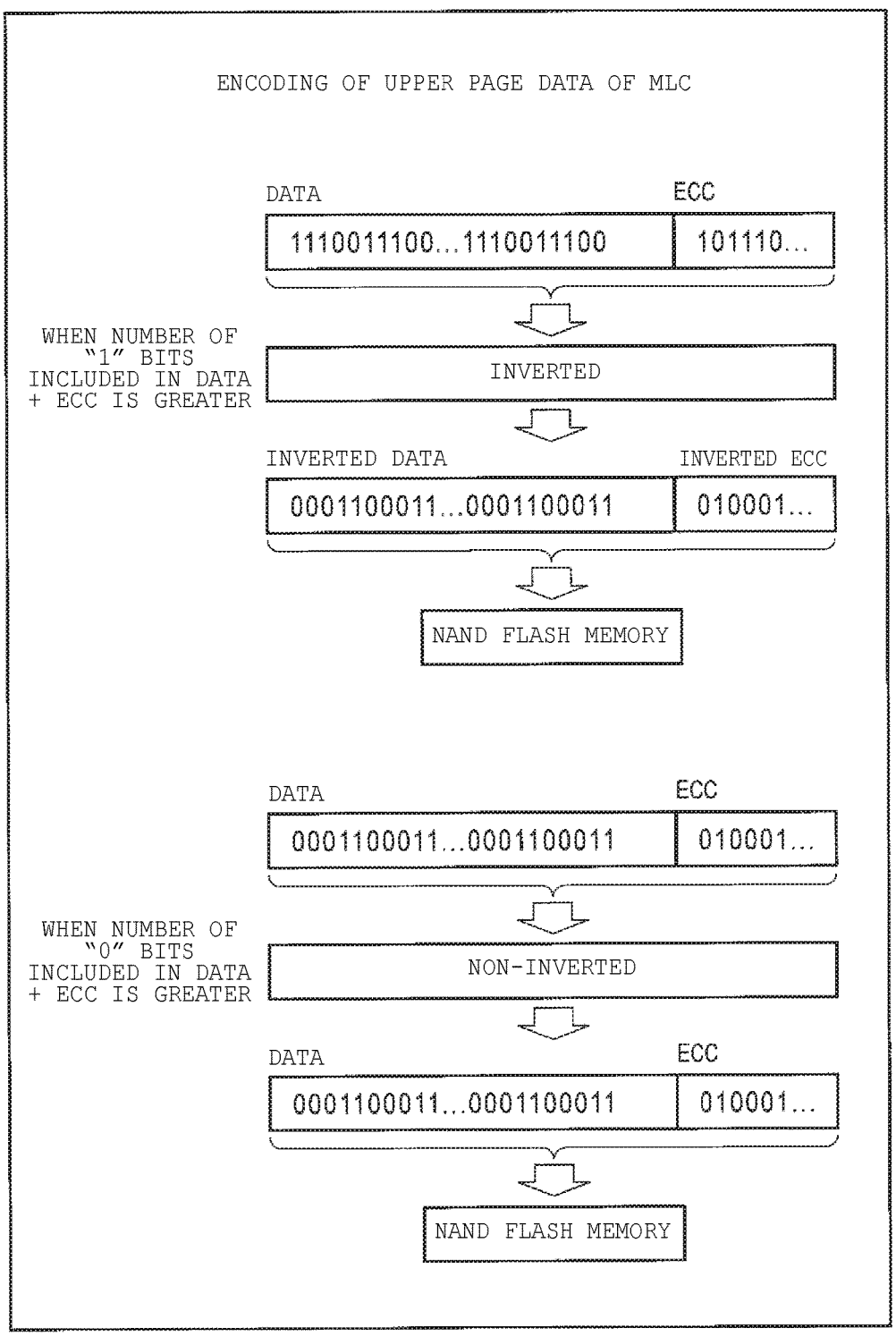
FIG. 8 illustrates an operation of encoding write data to be written on an upper page of an MLC flash memory and an ECC for the write data.

FIG. 8 illustrates an operation of encoding write data (upper page data) to be written on an upper page of an MLC flash memory and an ECC for the write data.

In this case, the data series including the write data and the ECC is encoded so as to increase the number of "0"s.

As illustrated in the upper part of FIG. 8, when the number of "1" bits included in the data series is greater than the number of "0" bits included in the data series, a bit inversion operation of inverting all bits of the data series is executed. As a result, the inverted data (the inverted write data and the inverted ECC) of the data series are generated as the encoded data. Then, the encoded data are written on a target page location (here, an upper page of a certain physical page) of the NAND flash memory 5.

In contrast, as illustrated in the lower part of FIG. 8, when the number of "0" bits included in the data series is greater than the number of "1" bits included in the data series, the bit inversion operation is not executed. As a result, the original data series (the original write data and the original ECC) is generated as encoded data. Then, the encoded data are written on a target page location (here, an upper page of a certain physical page) of the NAND flash memory 5.

Figure 9:
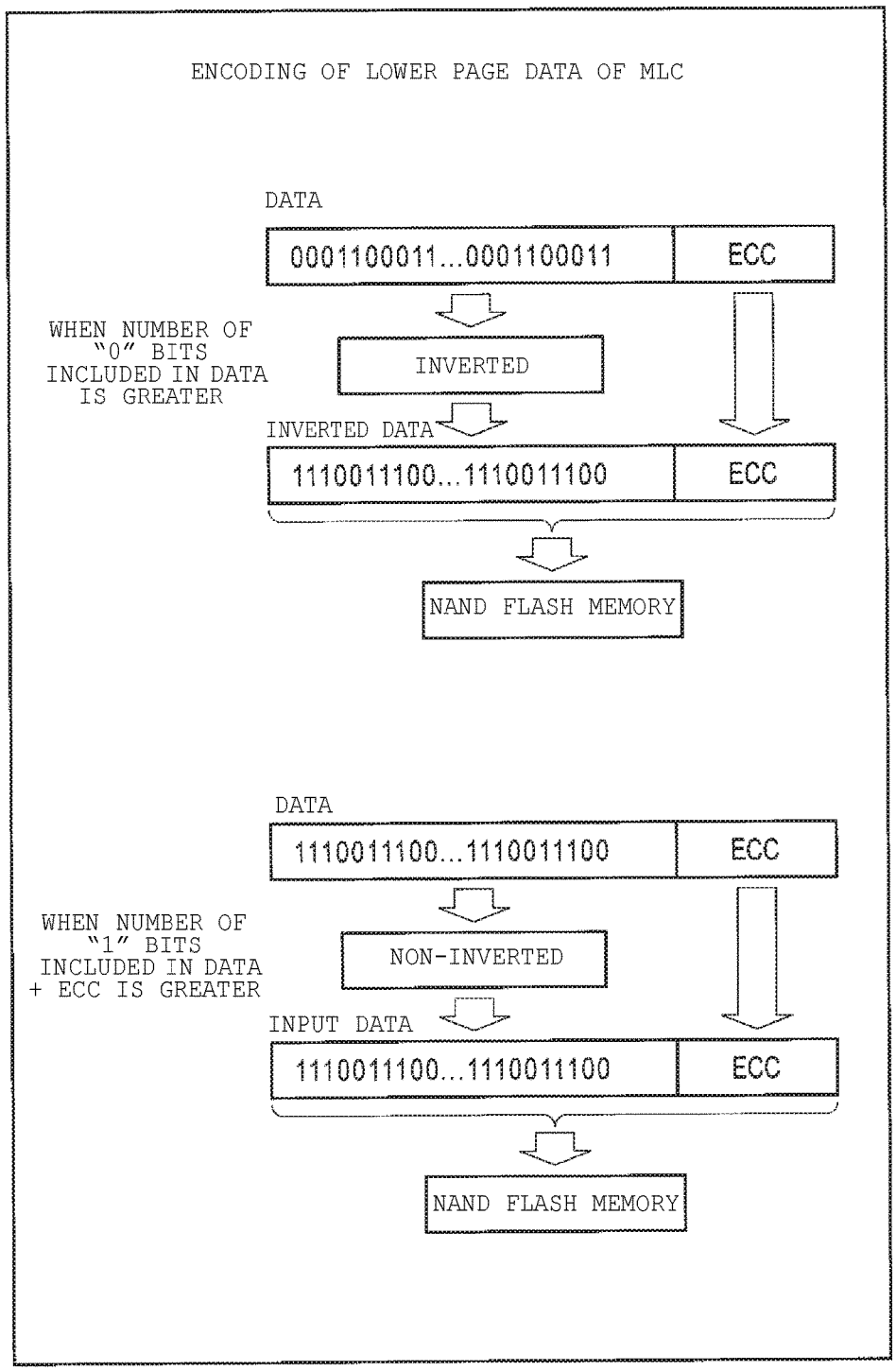
FIG. 9 illustrates an operation of encoding write data to be written on a lower page of an MLC flash memory and writing the encoded write data along with an ECC for original write data.

FIG. 9 illustrates an operation of encoding only write data (lower page data) to be written on a lower page of an MLC flash memory and writing the encoded write data along with an ECC for original write data.

In this case, the write data are encoded so as to increase the number of "1"s.

As illustrated in the upper part of FIG. 9, when the number of "0" bits included in the write data is greater than the number of "1" bits included in the write data, a bit inversion operation of inverting all bits of the write data is executed. Through the bit inversion operation, "1" bits in the write data are converted into "0" bits and "0" bits in the write data are converted into "1" bits. As a result, the inverted data of the write data are generated as encoded data. Then, the encoded data are written on a target page location (here, a lower page of a certain physical page) of the NAND flash memory 5 along with the ECC corresponding to the original write data.

In contrast, as illustrated in the lower part of FIG. 9, when the number of "1" bits included in the write data is greater than the number of "0" bits included in the write data, the bit inversion operation is not executed. As a result, the original write data is generated as encoded data. Then, the encoded data are written on a target page location (here, a lower page of a certain physical page) of the NAND flash memory 5 along with the ECC corresponding to the original write data.

Figure 10:
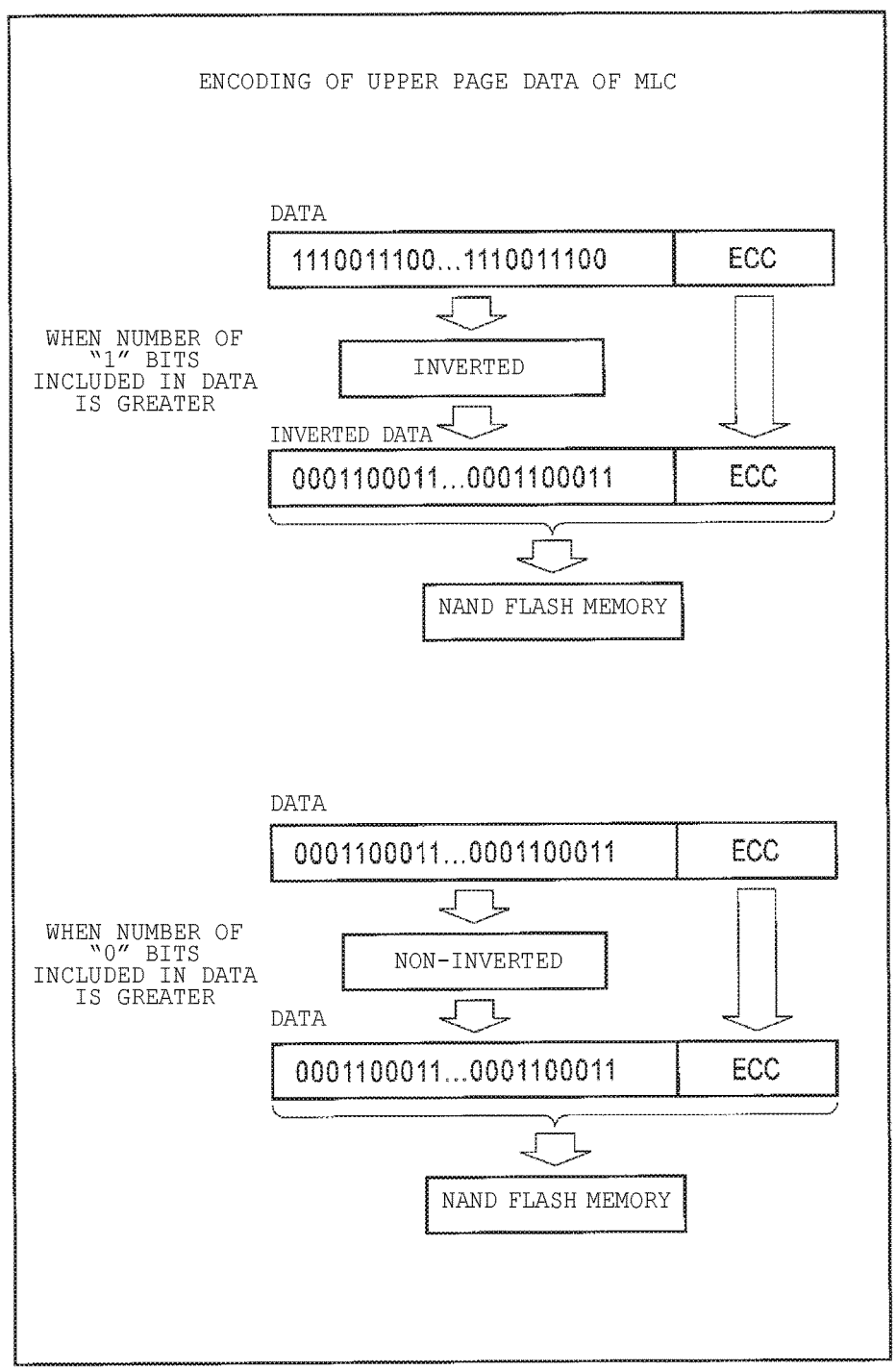
FIG. 10 illustrates an operation of encoding write data to be written on an upper page of an MLC flash memory and writing the encoded write data along with an ECC for original write data.

FIG. 10 illustrates an operation of encoding only write data (upper page data) to be written on an upper page of an MLC flash memory and writing the encoded write data along with an ECC for original write data.

In this case, the write data are encoded so as to increase the number of "0"s.

As illustrated in the upper part of FIG. 10, when the number of "1" bits included in the write data is greater than the number of "0" bits included in the write data, a bit inversion operation of inverting all bits of the write data is executed. As a result, the inverted data of the write data are generated as the encoded data. Then, the encoded data are written on a target page location (here, an upper page of a certain physical page) of the NAND flash memory 5 along with the ECC corresponding to the original write data.

In contrast, as illustrated in the lower part of FIG. 10, when the number of "0" bits included in the write data is greater than the number of "1" bits included in the write data, the bit inversion operation is not executed. As a result, the original write data are generated as the encoded data. Then, the encoded data are written on a target page location (here, an upper page of a certain physical page) of the NAND flash memory 5 along with the ECC corresponding to the original write data.

Figure 11:
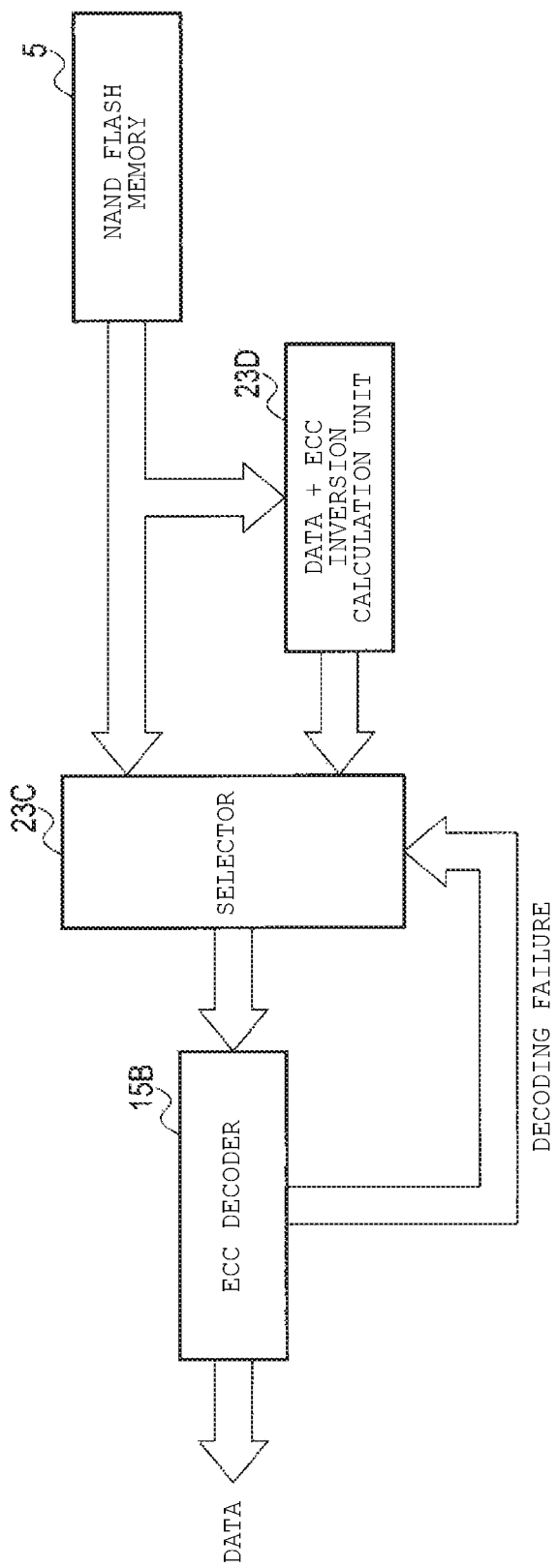
FIG. 11 is a block diagram of a decoder in the memory system according to the embodiment.

FIG. 11 illustrates a configuration of an endurance decoder in the endurance code encoder/decoder 23.

The endurance decoder includes a selector 23C and an inversion calculation unit 23D. The selector 23C and the inversion calculation unit 23D normally transmits the data and the ECC read from the NAND flash memory 5 to an ECC decoder 15B without inverting the data and the ECC read from the NAND flash memory 5. When a decoding failure occurs during an ECC decoding process by the ECC decoder 15B, the selector 23C and the inversion calculation unit 23D execute a bit inversion operation on each of the data read from the NAND flash memory 5 and the ECC read from the NAND flash memory 5, and transmits the inverted data and the inverted ECC to the ECC decoder 15B.

During a data read operation, the data and the ECC are first read from a reading target page. The read data and the read ECC are supplied to a first input of the selector 23C. The read data and the read ECC are also supplied to the inversion calculation unit 23D. The inversion calculation unit 23D executes the bit inversion operation on each of the data read from the NAND flash memory 5 and the ECC read from the NAND flash memory 5 to generate the inverted data in which each bit of the read data is inverted and the inverted ECC in which each bit of the read ECC is inverted. The inverted data and the inverted ECC are supplied to a second input of the selector 23C.

Normally, the selector 23C selects the first input. Therefore, the read data and an ECC are transmitted to the ECC decoder 15B. The ECC decoder 15B executes an error correction decoding process (an ECC decoding process) to correct an error of the data using the data and the ECC.

When the ECC decoding process is executed using the read data and an ECC despite storing of the inverted data and the inverted ECC in a reading target page, a decoding failure occurs during the ECC decoding process due to presence of the number of errors exceeding an error correction capability of the ECC. The ECC decoder 15B notifies the selector 23C of the decoding failure. When the selector 23C is notified of the decoding failure, the selector 23C selects the second input. As a result, the inverted data and the inverted ECC are transmitted to the ECC decoder 15B. The ECC decoder 15B executes the above-described ECC decoding process again using the inverted data and the inverted ECC.

When only the write data are encoded and the encoded write data are written along with the ECC for the original write data, the inversion calculation unit 23D may invert only the data read from the NAND flash memory 5.

FIG. 12 illustrates probability of each of a threshold voltage distribution "Er" and a threshold voltage distribution "C" before application of endurance code encoding and probability of each of a threshold voltage distribution "Er" and a threshold voltage distribution "C" after the application of the endurance code encoding in an MLC flash memory.

Here, a ratio of one of "1" and "0" included in the write data is assumed to be high.

For example, when a ratio of the number of bits of "1" to the number of bits of "0" is biased to 6:4 (the number of "1"s: the number of "0"s=6:4), probabilities of the threshold voltage distributions "Er" and "C" before the application of the endurance code encoding (before the improvement) are "0.36" and "0.24", respectively, as illustrated in the right part of FIG. 12. In contrast, after the application of the endurance code encoding (after the improvement), probabilities of the threshold voltage distributions "Er" and "C" are decreased to "0.24" and "0.16", respectively, as illustrated in the left part of FIG. 12.

FIG. 13 illustrates probability of each of the threshold voltage distribution "Er" and the threshold voltage distribution "G" before application of endurance code encoding and probability of each of the threshold voltage distribution "Er" and the threshold voltage distribution "G" after the application of the endurance code encoding in a TLC flash memory.

Here, a ratio of one of "1" and "0" included in the write data is assumed to be high.

For example, when a ratio of the number of bits of "1" to the number of bits of "0" is biased to 6:4 (the number of "1"s: the number of "0"s=6:4), probabilities of the threshold voltage distributions "Er" and "G" before the application of the endurance code encoding (before the improvement) are "0.216" and "0.144", respectively, as illustrated in the upper part of FIG. 13.

After the application of the encoding rule #1 (after the improvement), probabilities of the threshold voltage distributions "Er" and "G" are decreased to "0.096" and "0.064", respectively, as illustrated in the lower left part of FIG. 13.

After the application of the encoding rule #2 (after the improvement), probabilities of the threshold voltage distributions "Er" and "G" are decreased to "0.144" and "0.096", respectively, as illustrated in the lower right part of FIG. 13.

Figure 14:
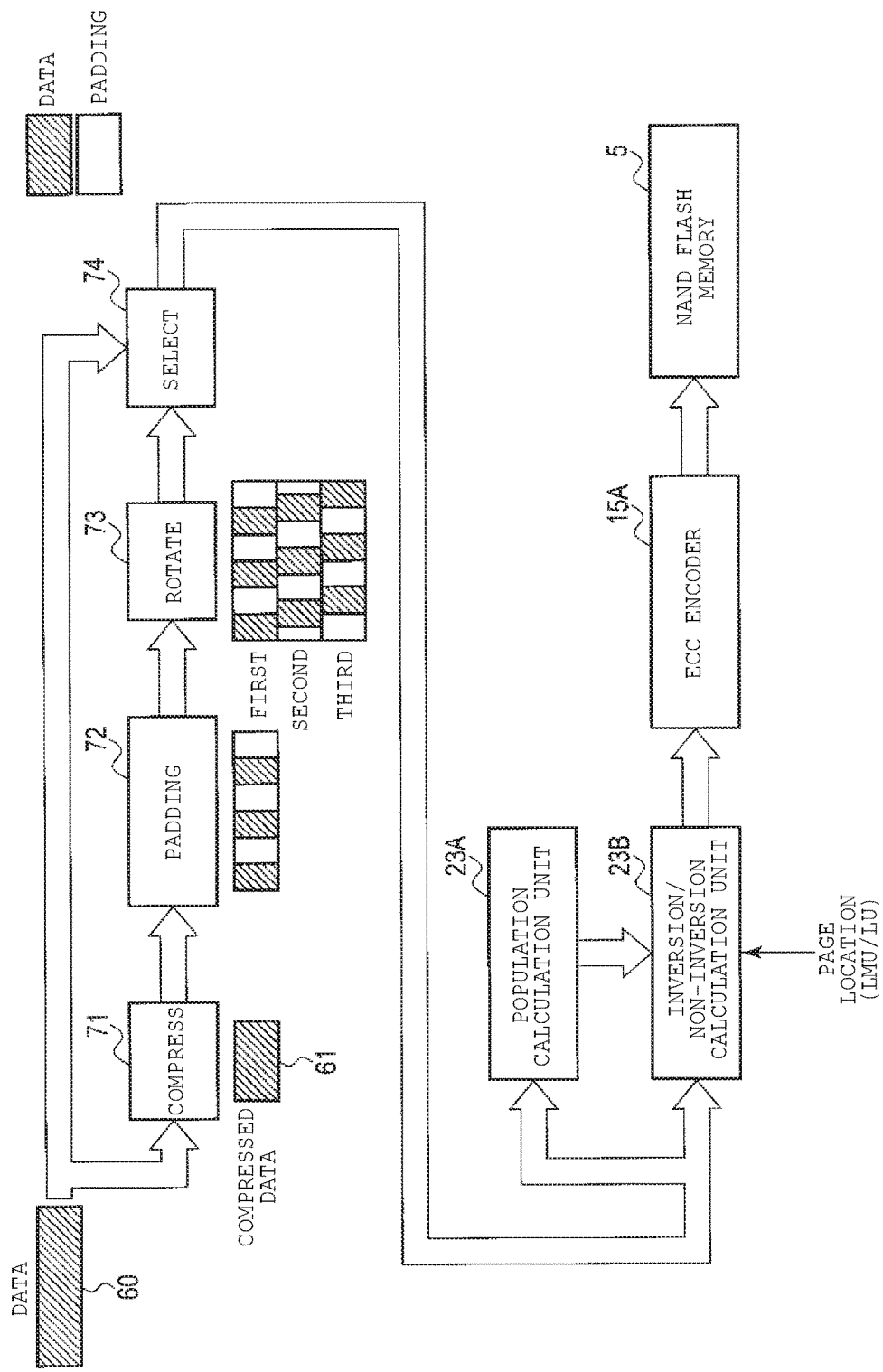
FIG. 14 is a block diagram of another example of the encoder in the memory system according to the embodiment.

FIG. 14 illustrates another configuration of the endurance code encoder.

In the endurance code encoder of FIG. 14, a data compression process is combined.

The compression process is executed to increase bias of "1"/"0" in the write data. As a result, it is possible to obtain encoded data in which the ratio of the number of bits of "1" included in the encoded data is greater or encoded data in which the ratio of the number of bits of "0" included in the encoded data is greater.

The endurance code encoder of FIG. 14 further includes a compression unit 71 configured to compress the write data in addition to the population calculation unit 23A and the inversion/non-inversion calculation unit 23B. The endurance code encoder may further include a padding unit 72, a rotation unit 73, and a selection unit 74.

Write data (page data) 60 with a size equivalent to one page are transmitted to the compression unit 71. The compression unit 71 compresses the write data 60. In this case, the compression unit 71 may execute lossless compression on the write data 60. Normally, the size of compressed data 61 (compressed write data) obtained by compressing the write data 60 is less than the size (the size of one page) of the write data (page data) before compression. The compressed data 61 are transmitted to the padding unit 72.

The padding unit 72 executes a process of padding a free region of page data to be written, which is obtained by compressing the write data, with padding data including a bit string in which all bits are "1" or a bit string in which all bits are "0". The size of the free region is equivalent to the remaining size obtained by subtracting the size of the compressed data 61 from the size of one page. That is, the padding data (a bit string in which bits are all "1" or a bit string in which bits are all "0") is added to the compressed data 61 to generate a data series including the compressed data 61 and the padding data. The data series has the size of one page, and thus is treated as page data to be written.

The padding data may be added at a position subsequent to the compressed data 61 or may be segmented into a plurality of padding data portions to be distributed to a plurality of padding positions. A position at which the bit string of the padding data is added (inserted) in the page data can be decided according to a mathematical rule (calculation). FIG. 14 exemplifies the padding data segmented into three padding data portions, where the three padding positions are distributed to three padding positions.

In the padding process, the padding unit 72 may count the number of "1" bits (or the number of "0" bits) included in the compressed data 61 and determine which of "0" bits or "1" bits are included more in the compressed data 61.

When the number of "1" bits included in the compressed data 61 is greater than the number of "0" bits included in the compressed data 61, the padding unit 72 executes the padding process using a bit string in which all bits are "1". As a result, a bias of "1"/"0" in the page data to be written can be increased.

When the number of "0" bits included in the compressed data 61 is greater than the number of "1" bits included in the compressed data 61, the padding unit 72 executes the padding process using a bit string in which all bits are "0". As a result, a bias of "1"/"0" in the page data to be written can be increased.

Further, when the number of "0" bits included in the compressed data 61 is substantially the same as the number of "1" bits, the padding process may be executed using either a bit string in which all bits are "1" or a bit string in which all bits are "0".

A bit string in which all bits are "1" (or a bit string in which all bits are "0") may be normally used as the padding data, irrespective of a bias situation of "0"/"1" of the compressed data 61.

The rotation unit 73 rotates positions of the padding data along a plurality of padding positions decided in advance. This is because an amount of exhaustion of the memory cell caused due to the compressed data 61 is different from an amount of exhaustion of the memory cell caused due to the padding data. By rotating the padding data positions using the plurality of padding positions, it is possible to evenly distribute the exhaustion to all the memory cell positions.

For example, when three padding position decided in advance are used, the padding data are set at a first padding position during a first write operation on a writing destination block regardless of page in which data are written. When an erasing operation is executed on the writing destination block and subsequently a second write operation on the writing destination block is executed, the padding data are set at a second padding position regardless of page in which data are written. When the erasing operation is executed on the writing destination block and subsequently a third write operation on the writing destination block is executed, the padding data are set at a third padding position regardless of page in which data are written.

When the padding data are distributed to the plurality of padding positions in the page and the positions of the padding data are rotated along the plurality of padding positions, the padding data are rotated along a plurality of padding position sets decided in advance. Each of the plurality of padding position sets includes a plurality of padding positions.

The selection unit 74 selects either the data series including the compressed data 61 and the padding data or the write data 60 before compression as page data to be written.

When the bias of "0"/"1" of the write data 60 before compression is greater than the bias of "0"/"1" of the compression data 61 to which the padding data is added, the selection unit 74 may select the write data 60 before compression as the page data to be written.

More specifically, the selection unit 74 calculates the bias of the "0" or "1" of the write data 60 and the bias of "0" or "1" of the compressed data 61 to which the padding data are added. Then, the selection unit 74 selects the data to which the bias of "0" or "1" is greater from the write data 60 and the compressed data 61 to which the padding data are added. When the compressed data 61 to which the padding data are added has the greater bias of "0" or "1" than the write data 60, the compressed data 61 to which the padding data are added is selected as the page data to be written. When the write data 60 has the greater bias of "0" or "1" than the compressed data 61 to which the padding data are added, the write data 60 are selected as the page data to be written.

The selected data are treated as the page data to be written.

In this case, the selected data are transmitted to each of the population calculation unit 23A and the inversion/non-inversion calculation unit 23B. Which of "0" bits or "1" bits are included more in the selected data is determined, all bits of the selected data are inverted or non-inverted based on the determination result and a target page location on which the selected data are to be written, and encoded data corresponding to the selected data are generated. The encoded data may be written on the target page location of the NAND flash memory 5 along with the ECC corresponding to the original selected data generated by the ECC encoder 15A.

Alternatively, the ECC encoder 15A may be disposed at the front stage of the population calculation unit 23A and the inversion/non-inversion calculation unit 23B. In this case, the ECC for the selected data is first generated by the ECC encoder 15A. The selected data and the ECC are transmitted to each of the population calculation unit 23A and the inversion/non-inversion calculation unit 23B. Then, it is determined which of "0" bits or "1" bits are included more in a data series including the selected data and the ECC. Based on the determination result and the target page location on which the selected data are to be written, all bits of the data series including the selected data and the ECC are inverted or non-inverted, and encoded data (a pair of the selected data and the ECC or a pair of inverted selected data and an inverted ECC) are generated. Then, the encoded data are written on the target page location of the NAND flash memory 5.

Figure 15:
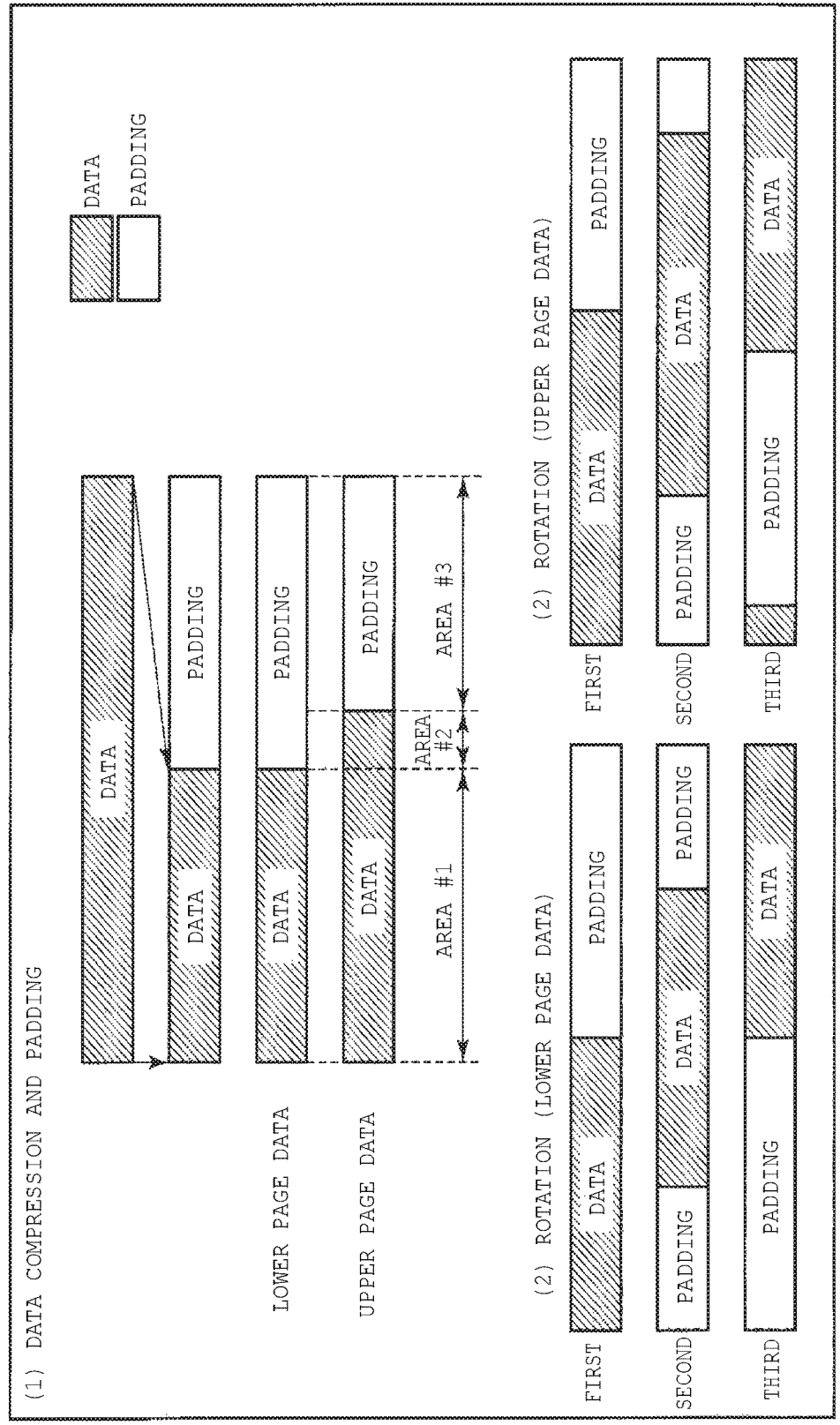
FIG. 15 illustrates padding and rotating operations executed by the memory system according to the embodiment.

FIG. 15 illustrates an operation of padding and rotation.

First, the write data are compressed to generate compressed data. Then, a process of padding a free region (a free region of page data to be written) of the compressed data with padding data including a bit string in which all bits are "1" and a bit string in which all bits are "0" is executed. The size of the compressed data may be different in accordance with the original write data. For that reason, the size of the compressed data corresponding to lower page data may be different from the size of the compressed data corresponding to upper page data. In FIG. 15, the size of the compressed data corresponding to the upper page data is assumed to be greater than the size of the compressed data corresponding to the lower page data. In this case, the size of the padding data corresponding to the upper page data is less than the size of the padding data corresponding to the lower page data.

In this case, a physical page on which both of the lower page data and the upper page data are written is logically segmented into three areas (areas #1, #2, and #3) in which amounts of exhaustion of the memory cell are different from each other. In area #1, a 2-bit code stored in each memory cell includes 1 bit of the compressed data of the lower page data and 1 bit of the compressed data of the upper page data. In area #2, a 2-bit code stored in each memory cell includes 1 bit of the padding data in the lower page data and 1 bit of the compressed data in the upper page data. In area #3, a 2-bit code stored in each memory cell includes 1 bit of the padding data in the lower page data and 1 bit of the padding data in the upper page data. Since the padding data are a bit string in which all bits are "1" or a bit string in which all bits are "0", each memory cell in area #3 can be programmed to a data state in which exhaustion is small through the inversion/non-inversion operation of the padding data in the lower page data/the upper page data, and thus exhaustion of each memory cell in area #3 can be set to be the smallest. That is, area #3 is an area in which probability in the data state in which the exhaustion is small is the highest. In contrast, since the compressed data are a bit pattern in which "1" bits and "0" bits coexist, there is a high possibility of the exhaustion of each memory cell in area #1 being greater than the exhaustion of each memory cell in area #3 and each memory cell in area #2.

In the present embodiment, the positions of the padding data are rotated among the plurality of padding positions decided in advance. For example, when the size of the physical page is 8 KB, a start position of the write data to which the padding data are added may be rotated among positions (for example, 0 KB-th, 2 KB-th, 4 KB-th, and 6 KB-th positions) in a page. In this way, by rotating the positions of the padding data along the plurality of padding positions, it is possible to distribute the position of area #3 to all physical pages, and thus it is possible to evenly distribute the amount of exhaustion to all memory cell positions.

Figure 16:
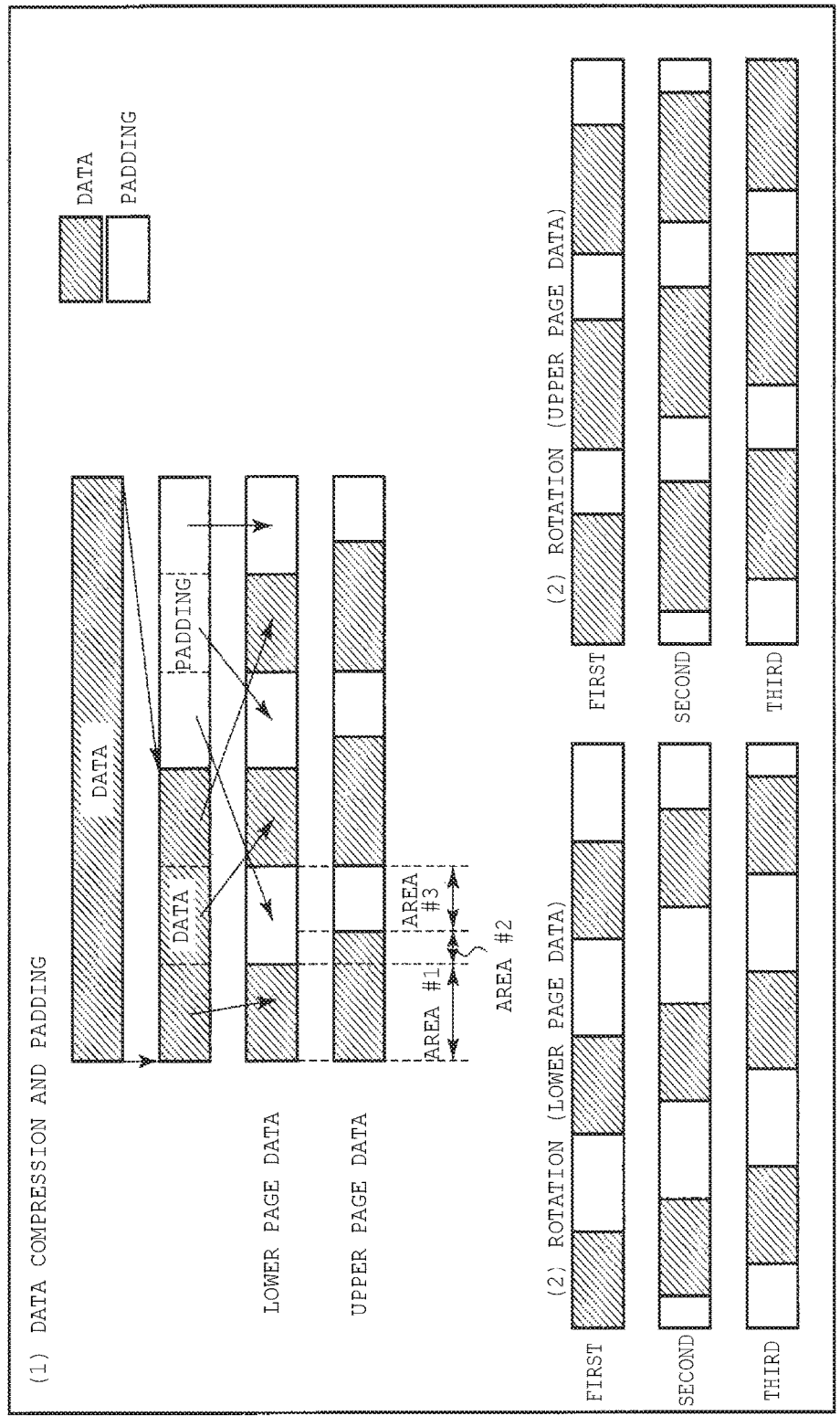
FIG. 16 illustrates other padding and rotating operations executed by the memory system according to the embodiment.

FIG. 16 illustrates another operation of padding and rotation.

First, the write data are compressed to generate compressed data. Then, a process of padding a free region (a free region of page data to be written) of the compressed data with padding data including a bit string in which all bits are "1" and a bit string in which all bits are "0" is executed. The padding data are divided into a plurality of padding data portions, and the padding data portions are distributed to a plurality of positions.

In either the lower page data or the upper page data, the padding position of each of the plurality of padding data portions is rotated along a plurality of padding position sets decided in advance. Accordingly, it is possible to evenly distribute the position of area #3 to all memory cell positions in the physical page.

Figure 17:
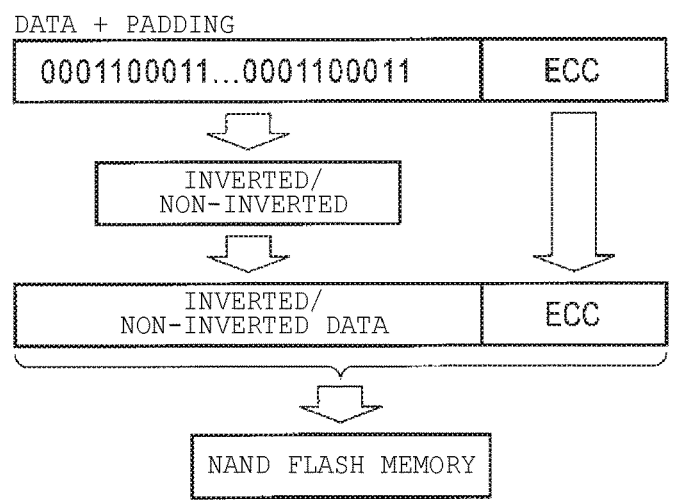
FIG. 17 illustrates an encoding operation carried out by the encoder in FIG. 14.

FIG. 17 illustrates an encoding operation carried out by the endurance code encoder of FIG. 14.

The number of "1" bits included in the data series including the compressed data and the padding data is counted, and then it is determined which of "0" bits or "1" bits are included more in the data series. Then, all bits of the data series are inverted or non-inverted based on the determination result and a target page location on which the data series is to be written, and encoded data is generated as a result. The encoded data are written on the target page location in the NAND flash memory 5 along with the ECC corresponding to the original data series (the compressed data+the padding data) generated by the ECC encoder 15A.

Figure 18:
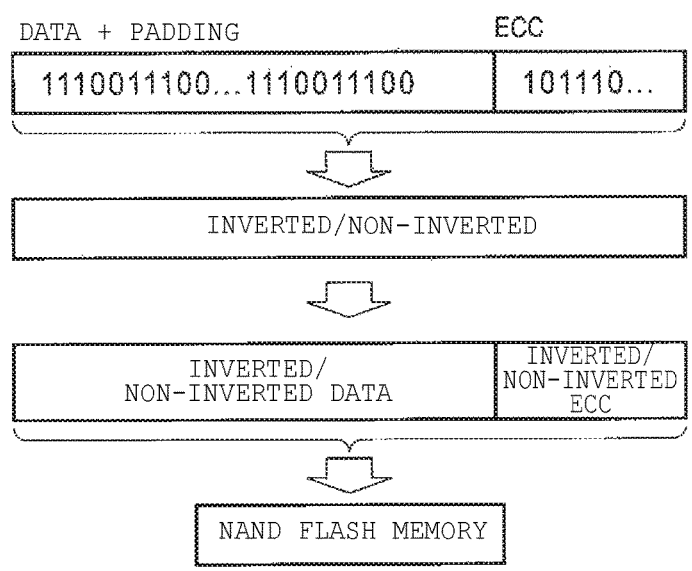
FIG. 18 illustrates another encoding operation carried out by the encoder in FIG. 14.

FIG. 18 illustrates another encoding operation applied to the endurance code encoder of FIG. 14.

An ECC for the data series including the compressed data and the padding data is first generated. Then, the number of "1" bits" included in the data series including the compressed data and the padding data is counted, and then it is determined which of "0" bits or "1" bits are included more in the data series (the compressed data+the padding data+the ECC). Then, all bits of the data series (the compressed data+the padding data+the ECC) are inverted or non-inverted based on the determination result and the target page location on which the data series (the compressed data+the padding data+the ECC) is to be written, and encoded data are generated as a result. The encoded data are written on the target page location of the NAND flash memory 5.

Figure 19:
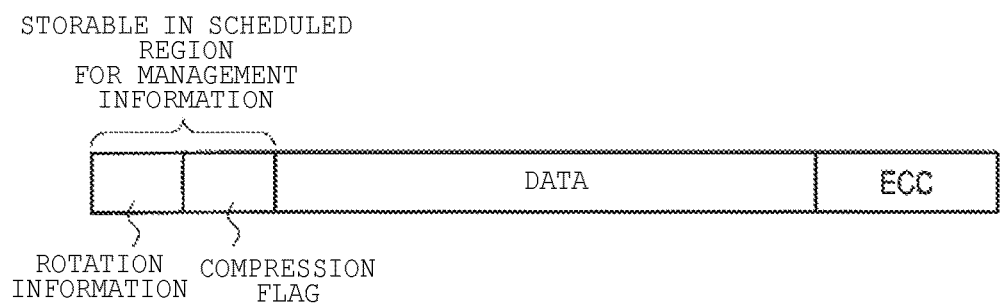
FIG. 19 illustrates a structure of encoded data generated by the encoder in FIG. 14.

In FIG. 19, encoded data indicating an example of the format of the encoded data generated by the endurance code encoder of FIG. 14 may further include rotation information (rotation information) and a compression flag as supplementary information indicating content of encoding in addition to the data (the compressed data+the padding data) and the ECC. The rotation information indicates a padding position. The compression flag indicates whether data are compressed.

The rotation information and the compression flag may be stored as management information in a storage region (a scheduled region for the management information) of the NAND flash memory 5 which is different from the physical page on which the data (the compressed data+the padding data) and the ECC are written.

Figure 20:
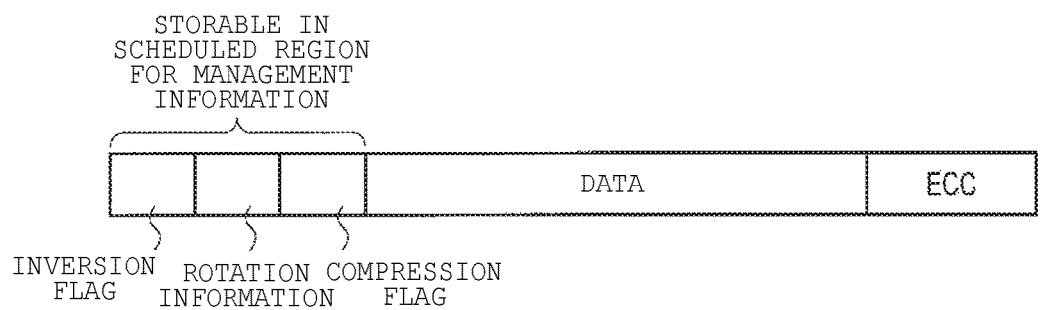
FIG. 20 illustrates another example of the structure of the encoded data generated by the encoder in FIG. 14.

As illustrated in FIG. 20, the encoded data may further include an inversion flag as supplementary information indicating content of encoding in addition to the rotation information and the compression flag. The inversion flag indicates whether or not the data (the compressed data+the padding data) are inverted. The rotation information, the compression flag, and the inversion flag may be stored as management information in a region of the NAND flash memory 5 which is different from the physical page on which the data (the compressed data+the padding data) and the ECC are written.

Figure 21:
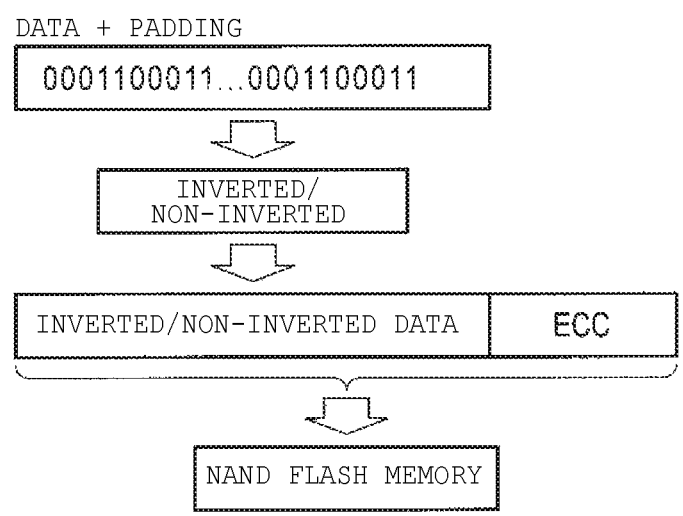
FIG. 21 illustrates still another encoding operation carried out by the encoder in FIG. 14.

When the encoded data include the inversion flag, the ECC may be generated from the inverted/non-inverted data (the compression data+the padding data), as illustrated in FIG. 21.

In this case, the number of "1" bits included in the data series including the compressed data and the padding data is counted, and then it is determined which of "0" bits or "1" bits are included more in the data series. Then, all bits of the data series are inverted or non-inverted based on the determination result and a target page location on which the data series is to be written, and encoded data are generated as a result. Then, an ECC for the encoded data is generated, the encoded data are written on the target page location of the NAND flash memory 5 along with the ECC generated from the encoded data.

Figure 22:
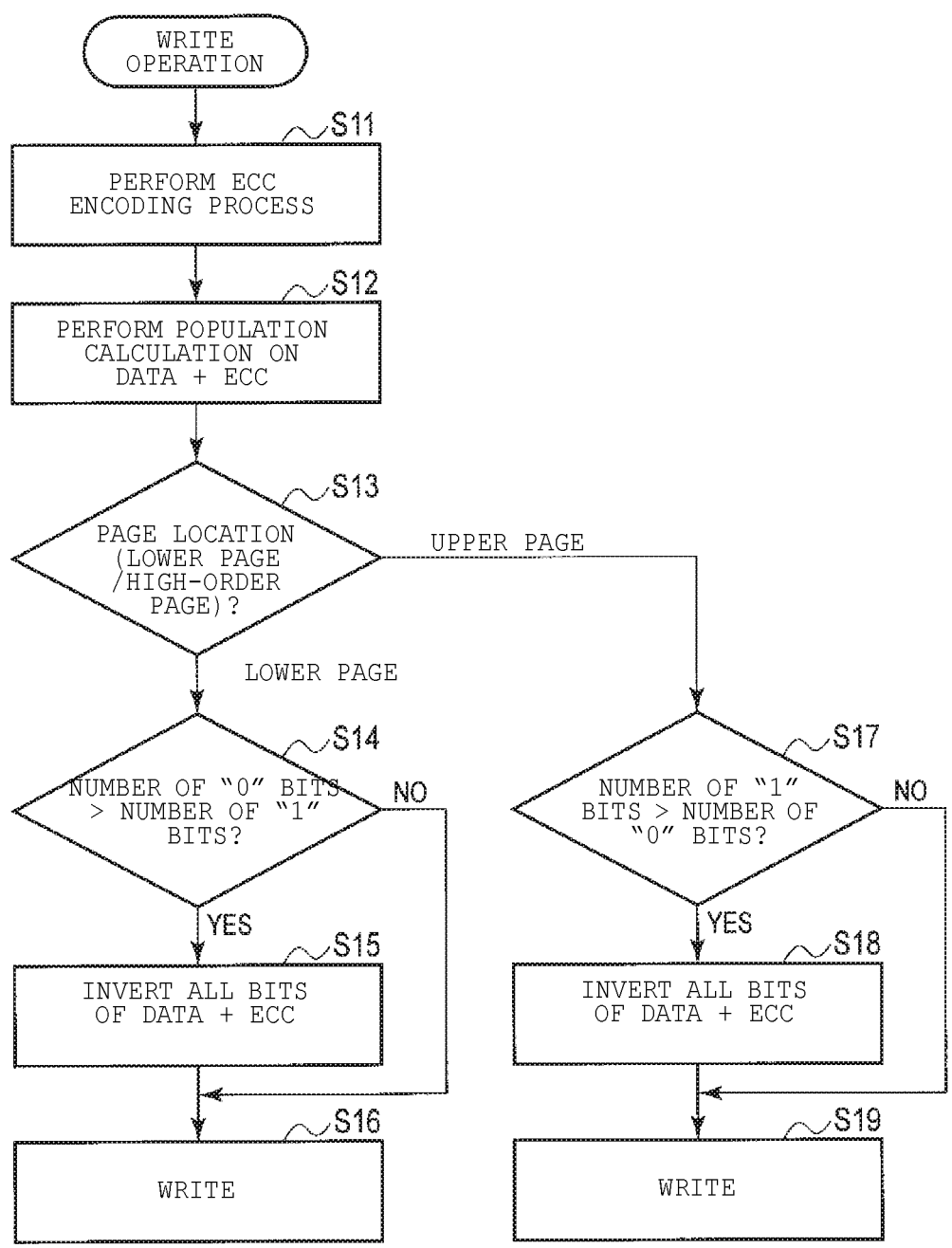
FIG. 22 is a flowchart illustrating a procedure of a write operation carried out by the memory system according to the embodiment.

The flowchart of FIG. 22 illustrates a procedure of a write operation of writing data on the NAND flash memory 5. Here, the NAND flash memory 5 is assumed to be an MLC flash memory.

The controller 4 reads write data to be written from the write buffer (WB) 31 and generates the ECC for the write data (step S11). The controller 4 executes calculation (population calculation) to count population of "1" (the number of "1" bits) included in the data series including the write data and the ECC (step S12).

Then, the controller 4 determines whether the target page location on which the write data are to be written is the lower page or the upper page (step S13). This determination may be executed based on the page address of the target page location.

When the target page location is the lower page, the controller 4 encodes the data series (the write data+the ECC) so as to increase the number of "1"s in the data series (the write data+the ECC). In this case, when the number of "0" bits in the data series (the write data+the ECC) is greater than the number of "1" bits in the data series (the write data+the ECC) (YES in step S14), the controller 4 outputs the inverted data (a pair of write data in which each bit of the write data is inverted and an inverted ECC in which each bit of the ECC is inverted) of the data series (the write data+the ECC) as the encoded data by inverting all bits of the data series (the write data+the ECC) (step S15). When the number of "1" bits in the data series (the write data+the ECC) is greater than the number of "0" bits in the data series (the write data+the ECC) (NO in step S14), the controller 4 outputs the data series (the write data+the ECC) as the encoded data without inverting the data series (the write data+the ECC).

Then, the controller 4 writes the pair of encoded data (the pair of inverted write data and inverted ECC or the pair of write data and ECC) on the target page location of the NAND flash memory 5 (step S16).

When the target page location is the upper page, the controller 4 encodes the data series (the write data+the ECC) so as to increase the number of "0"s in the data series (the write data+the ECC). In this case, when the number of "1" bits in the data series (the write data+the ECC) is greater than the number of "0" bits in the data series (the write data+the ECC) (YES in step S17), the controller 4 outputs the inverted data (a pair of write data in which each bit of the write data is inverted and an inverted ECC in which each bit of the ECC is inverted) of the data series (the write data+the ECC) as the encoded data by inverting all bits of the data series (the write data+the ECC) (step S18). In contrast, when the number of "0" bits in the data series (the write data+the ECC) is greater than the number of "1" bits in the data series (the write data+the ECC) (NO in step S17), the controller 4 outputs the data series (the write data+the ECC) as the encoded data without inverting the data series (the write data+the ECC).

Then, the controller 4 writes the pair of encoded data (the pair of inverted write data and inverted ECC or the pair of write data and ECC) on the target page location of the NAND flash memory 5 (step S19).

Figure 23:
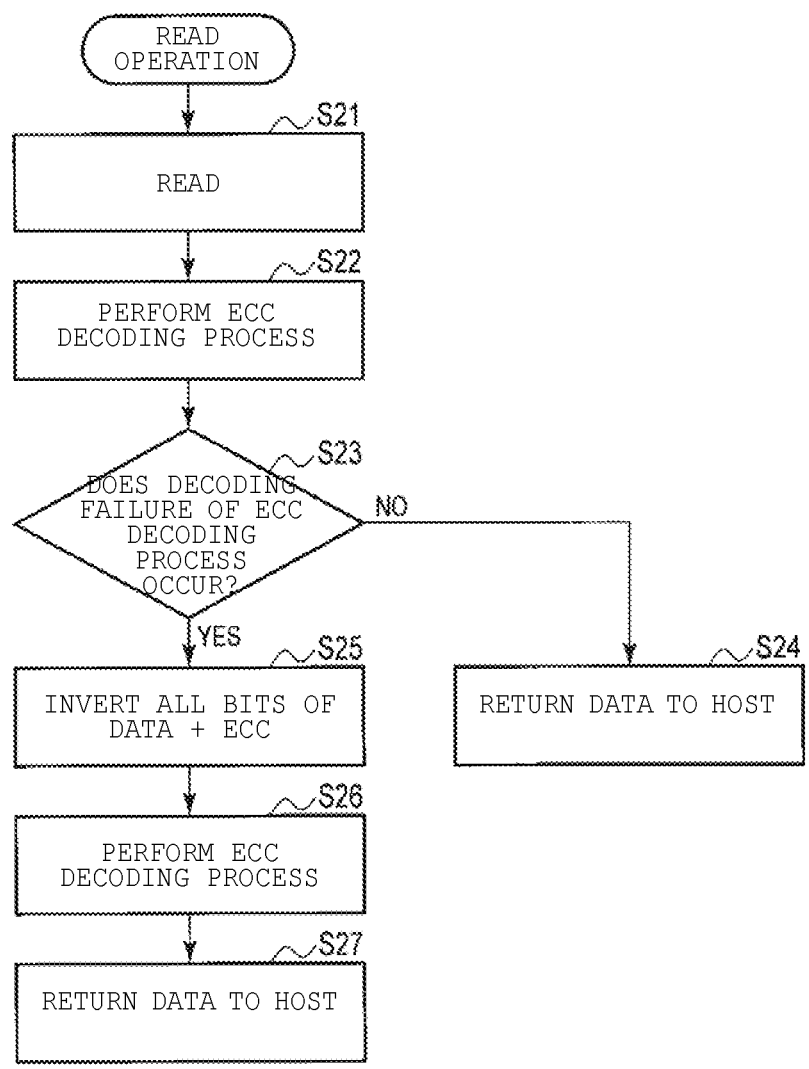
FIG. 23 is a flowchart illustrating a procedure of a read operation carried out by the memory system according to the embodiment.

The flowchart of FIG. 23 illustrates a procedure of a read operation for the data that were written through the write operation of FIG. 22.

When the controller 4 receives a read command (also referred to as a read request) from the host 2, the controller 4 reads data (here, the data and the ECC) from a page of the NAND flash memory 5 designated by the physical address corresponding to the LBA in the read command (step S21). Then, the controller 4 executes the ECC decoding process (the ECC decoding process) to correct an error of the read data using the read data and the read ECC (step S22). When the inverted data of the write data and the inverted ECC of the ECC are written on the page, a decoding failure of the ECC decoding process occurs.

When the decoding failure of the ECC decoding process does not occur (NO in step S23), the controller 4 returns the data decoded through the ECC decoding process to the host 2 (step S24).

In contrast, when the decoding failure of the ECC decoding process occurs (YES in step S23), the controller 4 inverts all bits of the data series including the read data and the read ECC and generates the inverted data in which each bit of the read data is inverted and the inverted ECC in which each bit of the read ECC is inverted (step S25). The controller 4 executes the ECC decoding process again using the inverted data and the inverted ECC (step S26) and returns the data decoded through the ECC decoding process to the host 2 (step S27).

Figure 24:
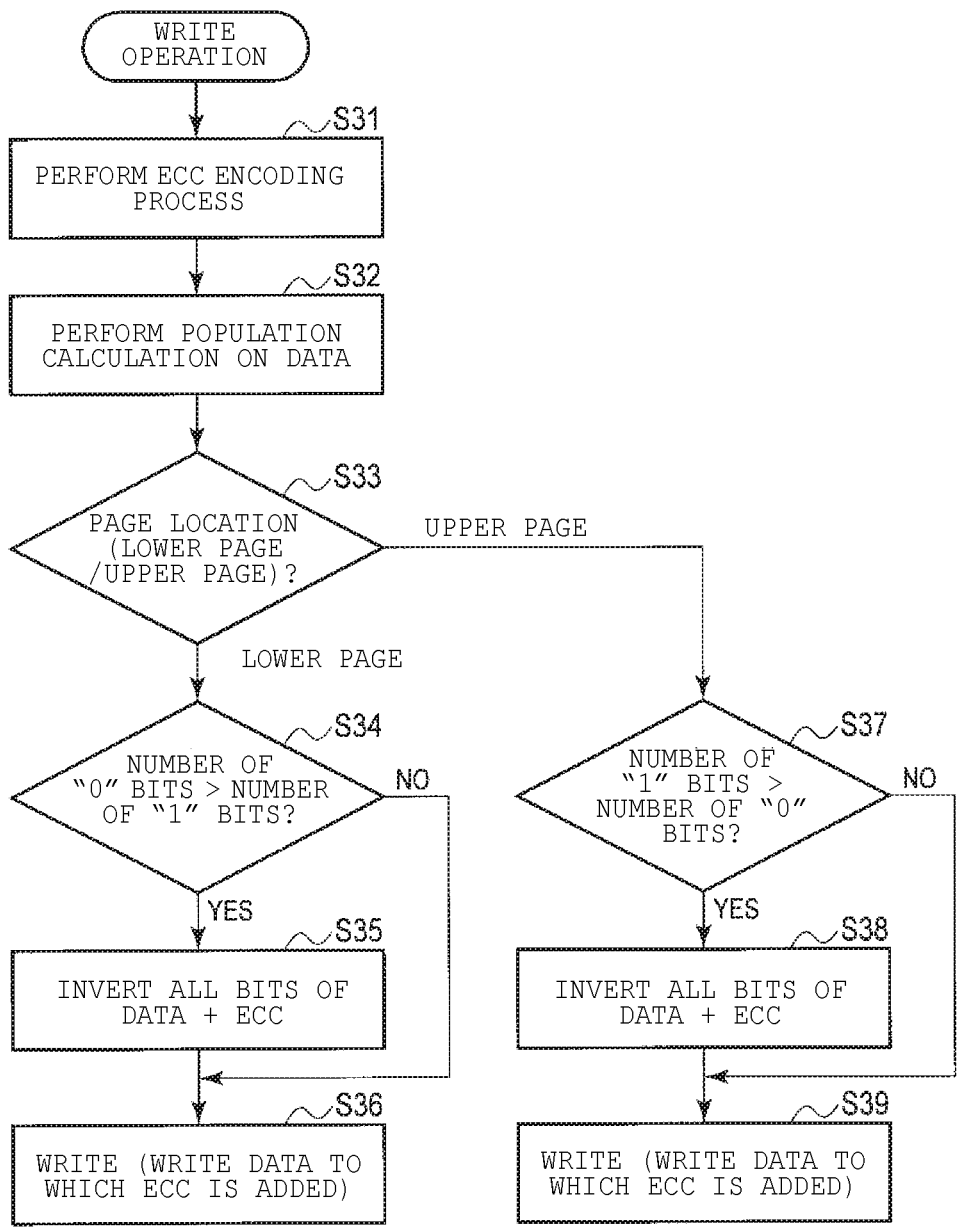
FIG. 24 is a flowchart illustrating another procedure of the write operation carried out by the memory system according to the embodiment.

The flowchart of FIG. 24 illustrates another procedure of the write operation of writing data on the NAND flash memory 5. Here, the NAND flash memory 5 is assumed to be an MLC flash memory.

The controller 4 reads write data to be written from the write buffer (WB) 31 and generates the ECC for the write data (step S31). The controller 4 executes calculation (population calculation) to count population of "1" (the number of "1" bits) included in the write data (step S32).

Then, the controller 4 determines whether the target page location on which the write data are to be written is the lower page or the upper page (step S33).

When the target page location is the lower page, the controller 4 encodes the write data so as to increase the number of "1"s in the write data. In this case, when the number of "0" bits in the write data is greater than the number of "1" bits in the write data (YES in step S34), the controller 4 outputs the inverted write data in which each bit of the write data are inverted as the encoded data by inverting all bits of the write data (step S35). When the number of "1" bits in the write data (the write data+the ECC) is greater than the number of "0" bits in the write data (NO in step S34), the controller 4 outputs the write data as the encoded data without inverting the write data.

Then, the controller 4 writes the encoded data to which the ECC generated in step S31 is added, that is, one of the pair of inverted write data and ECC generated in step S31 and the pair of write data and ECC generated in step S31 on the target page location in the NAND flash memory 5 (step S36).

When the target page location is the upper page, the controller 4 encodes the write data so as to increase the number of "0"s in the write data. In this case, when the number of "1" bits in the write data is greater than the number of "0" bits in the write data (YES in step S37), the controller 4 outputs the inverted write data in which each bit of the write data is inverted by inverting all bits of the write data as the encoded data (step S38). In contrast, when the number of "0" bits in the write data is greater than the number of "1" bits in the write data (NO in step S37), the controller 4 outputs the write data as the encoded data without inverting the write data.

Then, the controller 4 writes the encoded data to which the ECC generated in step S31 is added, that is, one of the pair of inverted write data and ECC generated in step S31 and the pair of write data and ECC generated in step S31 on the target page location of the NAND flash memory 5 (step S39).

Figure 25:
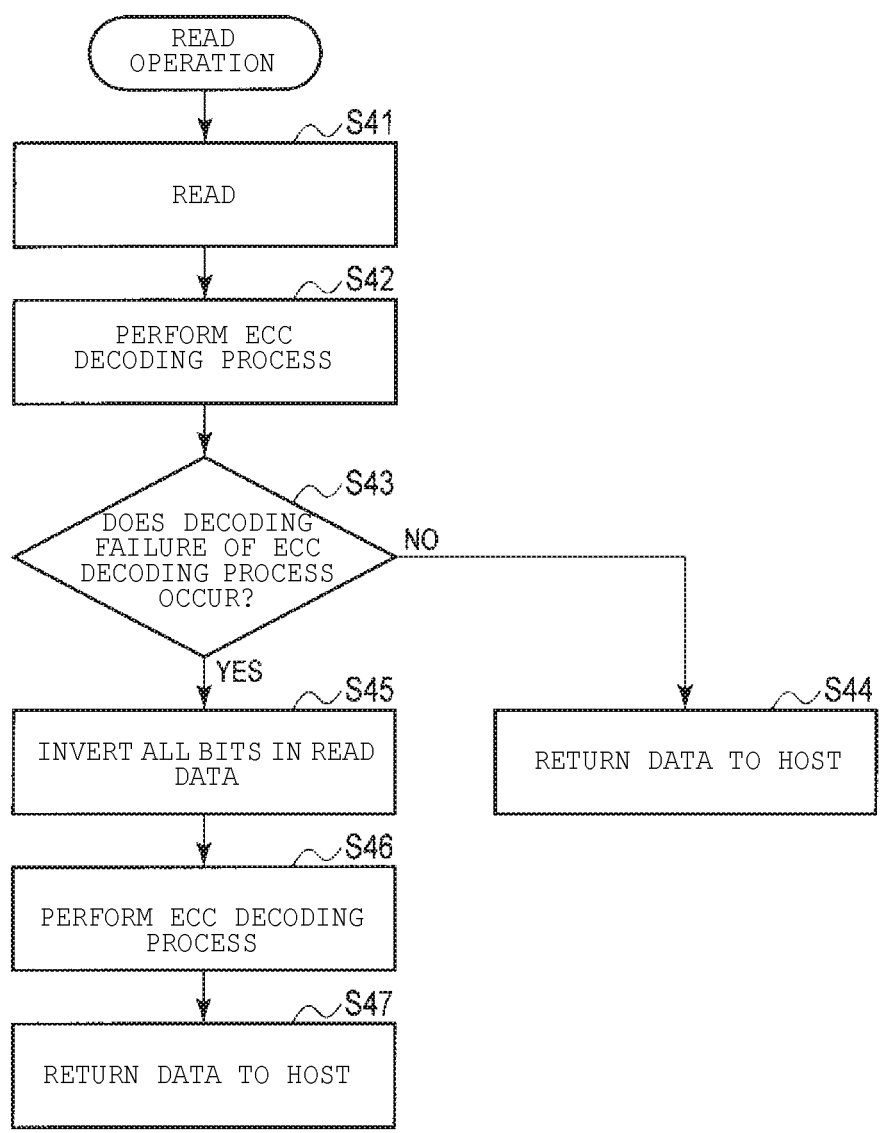
FIG. 25 is a flowchart illustrating another procedure of the read operation carried out by the memory system according to the embodiment.

The flowchart of FIG. 25 illustrates a procedure of a read operation for the data that were written through the write operation of FIG. 24.

When the controller 4 receives a read command (also referred to as a read request) from the host 2, the controller 4 reads data (here, the data and the ECC) from a page of the NAND flash memory 5 designated by the physical address corresponding to the LBA in the read command (step S41). The controller 4 executes the ECC decoding process (the ECC decoding process) to correct an error of the read data using the read data and the read ECC (step S42). When the inverted data of the write data are written on the page, a decoding failure of the ECC decoding process occurs.

When the decoding failure of the ECC decoding process does not occur (NO in step S43), the controller 4 returns the data decoded through the ECC decoding process to the host 2 (step S44).

In contrast, when the decoding failure of the ECC decoding process occurs (YES in step S43), the controller 4 inverts all bits of the read data and generates the inverted data in which each bit of the read data is inverted (step S45). The controller 4 executes the ECC decoding process again using the inverted data and the read ECC (step S46) and returns the data decoded through the ECC decoding process to the host 2 (step S47).

Figure 26:
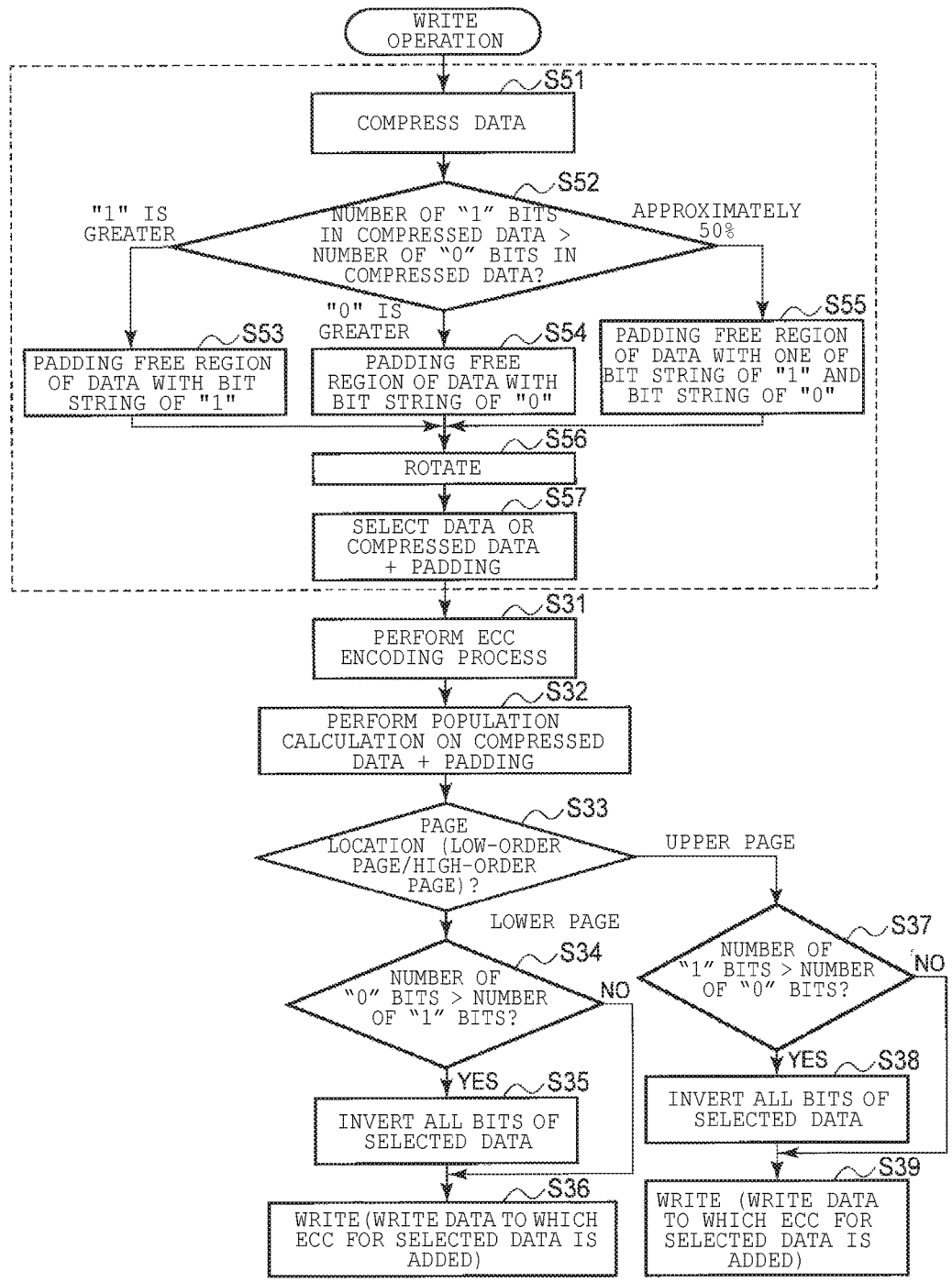
FIG. 26 is a flowchart illustrating still another procedure of the write operation carried out by the memory system according to the embodiment.

The flowchart of FIG. 26 illustrates a procedure of a write operation in which the write operation of FIG. 24 and a compression process are combined.

Here, data are assumed to be written on the NAND flash memory 5 (MLC flash memory).

In the write operation in which the compression process is combined, the processes of steps S51 to S57 may be executed before the processes of steps S31 to S39 of FIG. 24.

That is, the controller 4 first compresses the write data (step S51). The controller 4 determines which of "1" bits or "0" bits are included more in the compressed data generated in step S51 (step S52).

When a ratio of the number of "1" bits included in the compressed data is greater, the controller 4 executes a process of padding a free region of the write data with a bit string of "1" by adding the bit string of "1" to the compressed data (step S53).

When a ratio of the number of "0" bits included in the compressed data is greater, the controller 4 executes a process of padding a free region of the write data with a bit string of "0" by adding the bit string of "0" to the compressed data (step S54).

When the ratio of the number of "1" bits included in the compressed data is the same as the ratio of the numbers of bits of "0", the controller 4 executes a process of padding a free region of the write data with a predetermined bit string of "0" by adding one of the predetermined bit string of "0" and a predetermined bit string of "1" to the compressed data (step S55). Irrespective of the number of "1" (or "0") included in the compressed data, a process of padding a free region of the write data with one predetermined bit string between a bit string of "0" and a bit string of "1" may be executed.

In the process for the padding, the controller 4 may sort the compressed data into a plurality of data portions and distribute a bit string for the padding to a plurality of positions (padding positions) subsequent to the plurality of data portions. Further, the controller 4 may execute a process of rotating the padding positions among the plurality of padding positions (step S56).

The controller 4 selects, as processing target data, data in which the bias of "0" or "1" is greater between the write data before compression and the compressed data to which the bit string for the padding is added (step S57).

In subsequent steps S31 to S39, the controller 4 outputs the inverted/non-inverted data of the selected data as the encoded data by treating the selected data as the write data and writes the encoded data on the target page location along with the ECC for the selected data.

Figure 27:
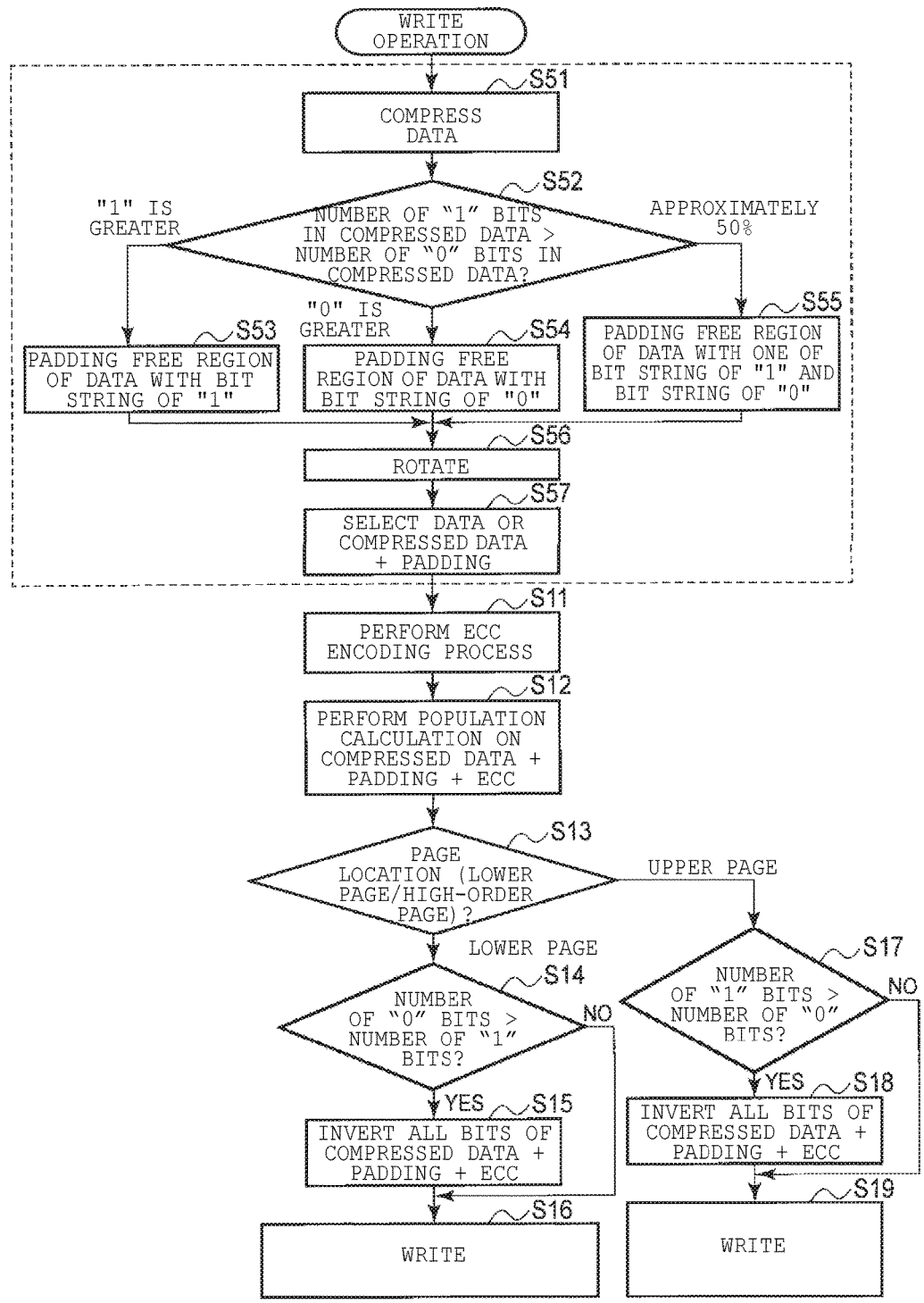
FIG. 27 is a flowchart illustrating still another procedure of the write operation carried out by the memory system according to the embodiment.

The flowchart of FIG. 27 illustrates a procedure of a write operation in which the write operation of FIG. 22 and a compression process are combined.

Here, data are assumed to be written on the NAND flash memory 5 (MLC flash memory).

In the write operation in which the compression process is combined, the processes of steps S51 to S57 of FIG. 26 may be executed before the processes of steps S11 to S19 described in FIG. 22.

Figure 28:
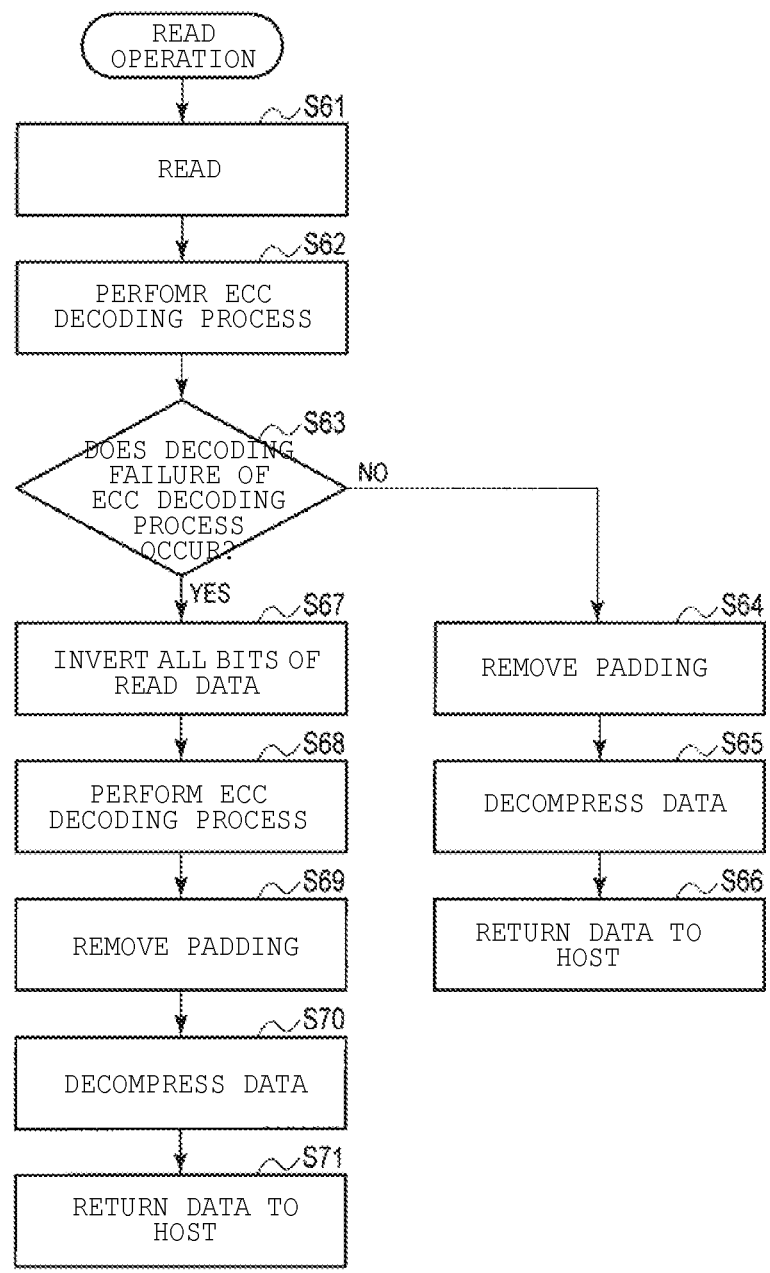
FIG. 28 is a flowchart illustrating still another procedure of the read operation carried out by the memory system according to the embodiment.

The flowchart of FIG. 28 illustrates a procedure of a read operation for the data written through the write operation of FIG. 26.

When the controller 4 receives a read command (also referred to as a read request) from the host 2, the controller 4 reads data (here, the data and the ECC) from a page of the NAND flash memory 5 designated by the physical address corresponding to the LBA in the read command (step S61). The controller 4 executes the ECC decoding process (the ECC decoding process) to correct an error of the read data using the read data and the read ECC (step S62). When the inverted data of the data series including the compressed data and the padding data are written on the page, a decoding failure of the ECC decoding process occurs.

When the decoding failure of the ECC decoding process does not occur (NO in step S63), the controller 4 removes the padding data from the data decoded through the ECC decoding process (step S64), decompresses the remaining data obtained by removing the padding data (step S65), and returns the decompressed data to the host 2 (step S66).

In contrast, when the decoding failure of the ECC decoding process occurs (YES in step S63), the controller 4 inverts all bits of the read data (the compressed data and the padding data) and generates the inverted data in which each bit of the read data is inverted (step S67). The controller 4 executes the ECC decoding process again using the inverted data and the read ECC (step S68). Then, the controller 4 removes the padding data from the data decoded through the ECC decoding process (step S69), decompresses the remaining data obtained by removing the padding data (step S70), and returns the decompressed data to the host 2 (step S71).

Figure 29:
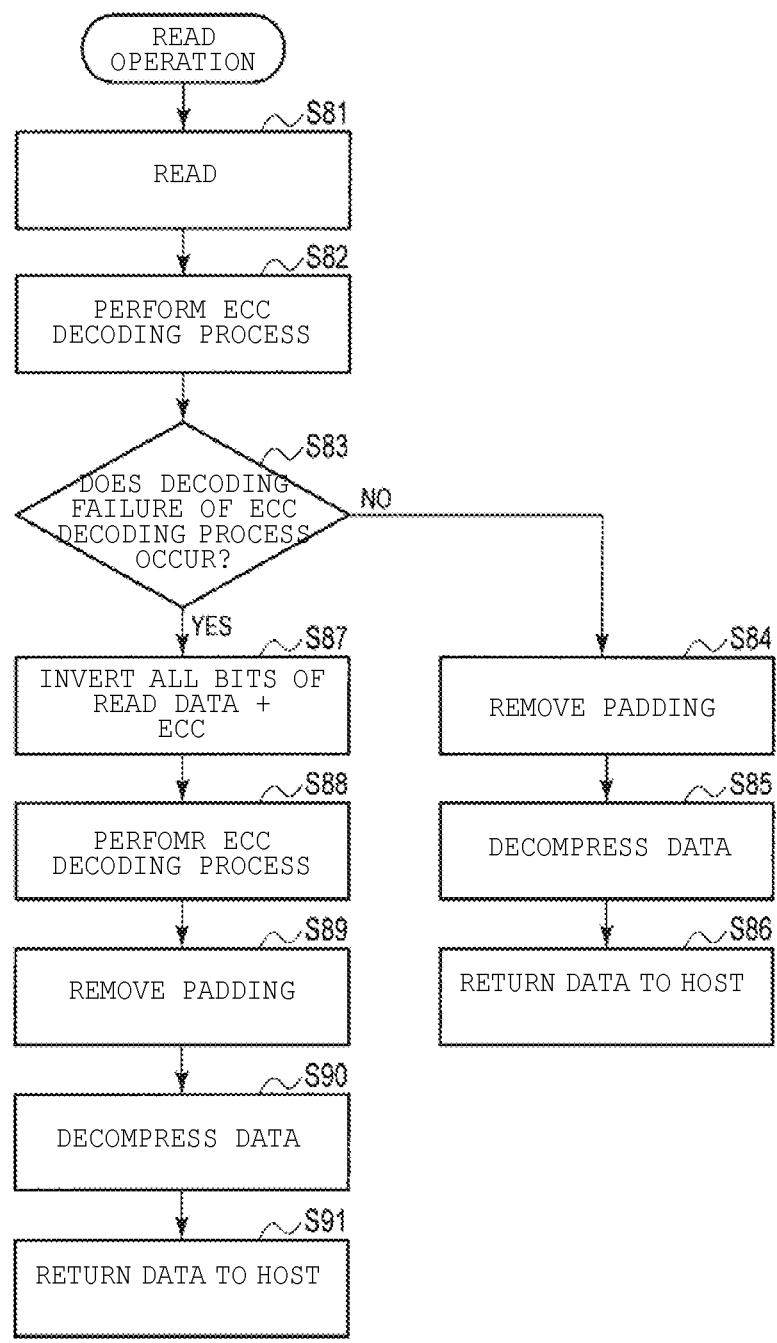
FIG. 29 is a flowchart illustrating still another procedure of the write operation carried out by the memory system according to the embodiment.

The flowchart of FIG. 29 illustrates a procedure of a read operation for the data written through the write operation of FIG. 27.

When the controller 4 receives a read command (also referred to as a read request) from the host 2, the controller 4 reads data (here, the data and the ECC) from a page of the NAND flash memory 5 designated by the physical address corresponding to the LBA in the read command (step S81). The controller 4 executes the ECC decoding process (the ECC decoding process) to correct an error of the read data using the read data and the read ECC (step S82). When the inverted ECC and the inverted data of the data series including the compressed data and the padding data are written on the page, a decoding failure of the ECC decoding process occurs.

When the decoding failure of the ECC decoding process does not occur (NO in step S83), the controller 4 removes the padding data from the data decoded through the ECC decoding process (step S84), decompresses the remaining data obtained by removing the padding data (step S85), and returns the decompressed data to the host 2 (step S86).

In contrast, when the decoding failure of the ECC decoding process occurs (YES in step S83), the controller 4 inverts all bits of the data series including the read data (the compressed data and the padding data) and the read ECC and generates the inverted data in which each bit of the read data is inverted and the inverted ECC in which each bit of the read ECC is inverted (step S87). The controller 4 executes the ECC decoding process again using the inverted data and the inverted ECC (step S88). Then, the controller 4 removes the padding data from the data decoded through the ECC decoding process (step S89), decompresses the remaining data obtained by removing the padding data (step S90), and returns the decompressed data to the host 2 (step S91).

Figure 30:
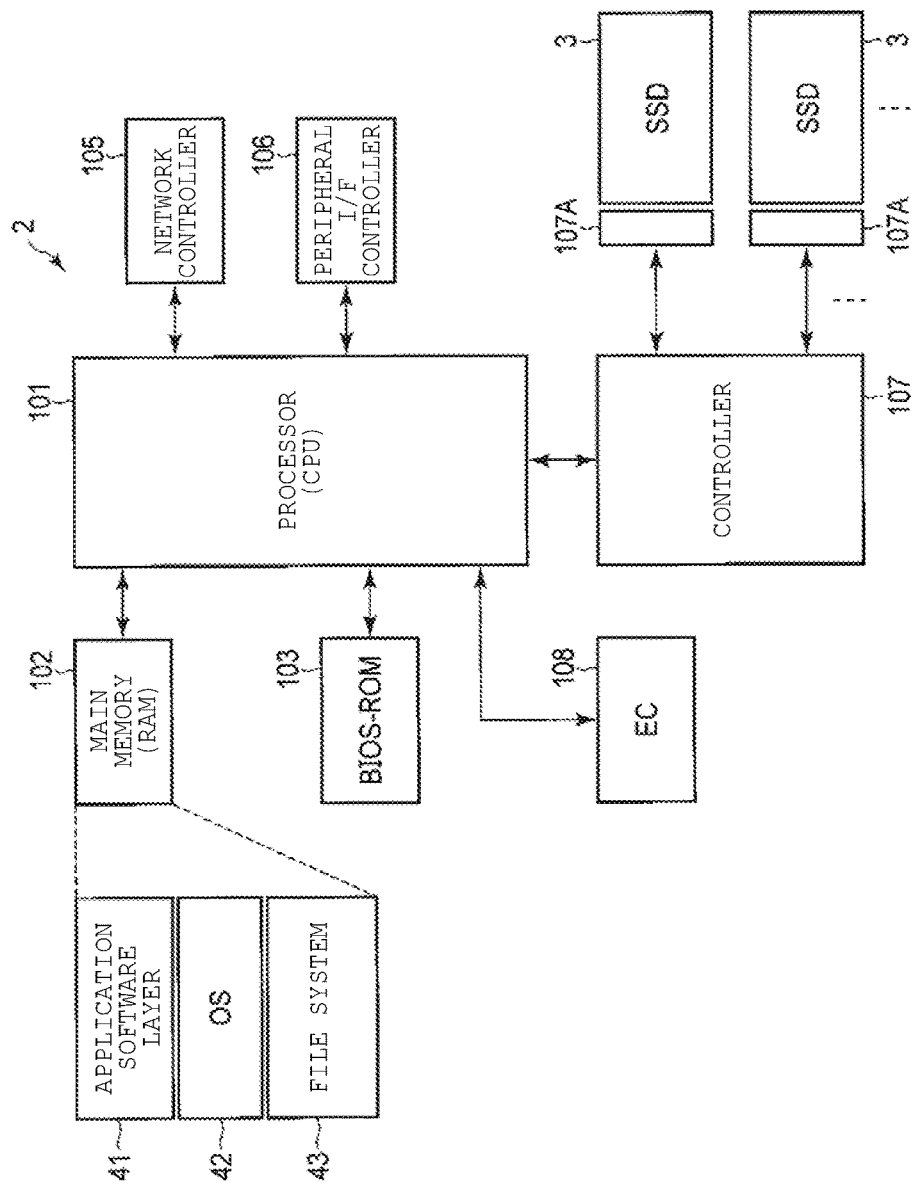
FIG. 30 is a block diagram of a host connectable to the memory system according to the embodiment.

FIG. 30 illustrates an example of a hardware configuration of an information processing device functioning as the host 2.

The information processing device is can be configured as a server computer or a personal computer. The information processing device includes a processor (CPU) 101, a main memory 102, a BIOS-ROM 103, a network controller 105, a peripheral interface controller 106, a controller 107, and an embedded controller (EC) 108.

The processor 101 is a CPU configured to control an operation of each component of the information processing device. The processor 101 executes various software programs loaded from any one of the plurality of SSDs 3 to the main memory 102. The main memory 102 is configured with a RAM such as a DRAM. The software programs executed by the processor 101 include the application software layer 41, the OS 42, and the file system 43 described above.

The processor 101 also executes a basic input and output system (BIOS) stored in the BIOS-ROM 103 which is a nonvolatile memory. The BIOS is a system software program that is executed to control hardware.

The network controller 105 is a communication device such as a wired LAN controller or a wireless LAN controller. The peripheral interface controller 106 is configured to execute communication with a peripheral device such as a USB device.

The controller 107 is configured to execute communication with a device connected to each of a plurality of connectors 107A. In the present embodiment, the plurality of SSDs 3 is respectively connected to the plurality of connectors 107A. The controller 107 is an SAS expander, a PCIe switch, a PCIe expander, a flash array controller, or a RAID controller.

The EC 108 functions as a system controller configured to execute power management of an information processing device. The EC 108 powers on or off an information processing device according to operation on a power switch by a user. The EC 108 is achieved as a process circuit such as a one-chip microcontroller. The EC 108 may contain a keyboard controller that controls an input device such as a keyboard (KB).

Figure 31:
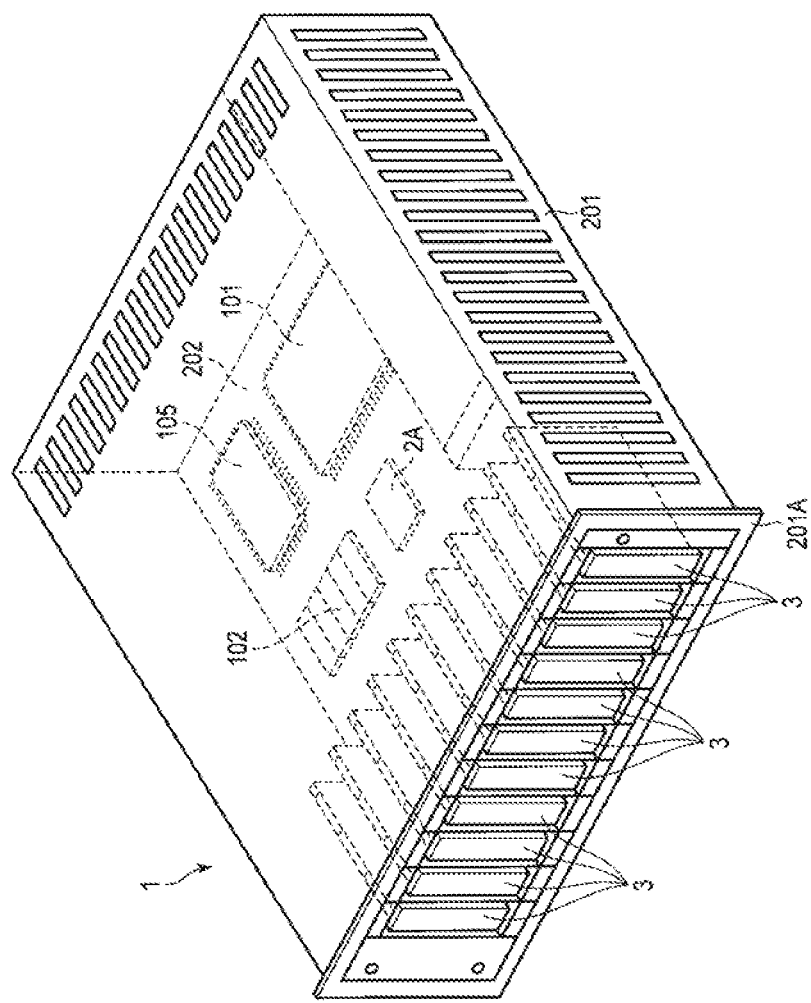
FIG. 31 is a transparent diagram illustrating a computer including the memory system and the host according to the embodiment.

FIG. 31 illustrates an example of the configuration of an information processing device including the plurality of SSDs 3 and the host 2.

The information processing device includes a thin box-like casing 201 that can be accommodated in a rack. The plurality of SSDs 3 may be disposed in the casing 201. In this case, each SSD 3 may be inserted to be detachable from a slot formed in a front surface 201A of the casing 201.

A system board (main board) 202 is disposed in the casing 201. Various electronic components including the CPU 101, the memory 102, the network controller 105, and the controller 107 are mounted on the system board (main board) 202. The electronic components function as the host 2.

According to the present embodiment, as described above, during the write operation, a first error correction code for first write data with a size equivalent to one page is generated. It is determined which of "0" bits or "1" bits are included more in a data series including the first write data and the first error correction code. Then, one of a pair of the first write data and the first error correction code and a pair of second write data in which each bit of the first write data is inverted and a second error correction code in which each bit of the first error correction code is inverted is written on a target page location based on a determination result and the target page location on which the first write data are to be written. During the read operation, data and an error correction code are read from a reading target page location and an error correction decoding process is executed to correct an error of the read data using the read data and the read error correction code. The error correction decoding process is executed again using inverted data in which each bit of the read data is inverted and an inverted error correction code in which each bit of the read error correction code is inverted when a decoding failure occurs during the error correction decoding process.

Instead of inversion/non-inversion of the data series including the first write data and the first error correction code, only the first write data may be inverted/non-inverted.

In this case, during a write operation, the first error correction code for the first write data is generated and it is determined which of "0" bits or "1" bits are included more in the first write data. Then, one of a pair of the first write data and the first error correction code and a pair of second write data in which each bit of the first write data is inverted and the first error correction code is written on a target page location based on a determination result and the target page location on which the first write data are to be written. During a read operation, data and an error correction code are read from a reading target page location and an error correction decoding process is executed to correct an error of the read data using the read data and the read error correction code. The error correction decoding process is executed again using inverted data in which each bit of the read data is inverted and the read error correction code when a decoding failure occurs during the error correction decoding process.

In this way, by inverting the data (or both of the data and the error correction code) and executing the error correction decoding process again in response to a decoding failure of the error correction decoding process, it is possible to write the encoded data in which exhaustion of the memory cell is small and a bit error rate is reduced without inserting supplementary information such as a switch flag indicating the inversion/non-inversion of the write data into the encoded data.

By further adding processes for data compression and padding data rotation, it is possible to further decrease the probabilities of codes (the 2-bit code corresponding to "Er" and the 2-bit code corresponding to "C") at both ends and further increase the probabilities of intermediate codes (the 2-bit code corresponding to "B" and the 2-bit code corresponding to "A"). Since the padding data positions are rotated using the plurality of padding positions, the exhaustion can be evenly distributed to all memory cell positions.

The processes according to the present embodiment can be applied not only to an MLC flash memory capable of storing data of 2 bits per memory cell and a TLC flash memory capable of storing data of 3 bits per memory cell but also to other types of flash memories capable of storing data of 4 or more bits per memory cell.

The compression process and the decompression process for the endurance code encoder/decoder 23 may be executed by dedicated hardware in the controller 4. All functions of the endurance code encoder/decoder 23 may also be performed by dedicated hardware in the controller 4.

In the present embodiment, the NAND memory is exemplified as the nonvolatile memory. However, the present embodiment can also be applied to other various nonvolatile memories such as a magnetoresistive random access memory (MRAM), a phase change random access memory (PRAM), a resistive random access memory (ReRAM), and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a nonvolatile memory; and
   a controller configured to perform read and write operations on the nonvolatile memory,
   wherein the controller is configured to, when performing the write operation:
      compress write data,
      attach one of first padding data of which values are all "0" and second padding data of which values are all "1", based on which of the "0" or "1" bit values are more populated in the compressed write data,
      encode a group of the compressed write data and one of the first and second padding data to generate coded data,
      generate an error correction code from the write data,
      determine whether or not to invert each bit of the coded data, based on a logical page position of the nonvolatile memory in which the coded data are to be written and the number of "0" bits in the coded data relative to the number of "1" bits, the logical page position being one of logical page positions including a lower page and an upper page,
      invert each bit of the coded data upon determining to invert, and
      write non-inverted coded data or the inverted coded data into the logical page position of the nonvolatile memory, and
   wherein the controller is configured to, when performing the read operation:
      read the coded data from the logical page position of the nonvolatile memory,
      carry out decoding of the read data,
      invert each bit of the read data when the decoding fails, and
      carry out decoding of the inverted read data.

2. The storage device according to claim 1, wherein
when the "0" bit values are more populated in the compressed write data than the "1" bit values, the controller attaches the first padding data to the compressed write data, and
when the "1" bit values are more populated in the compressed write data than the "0" bit values, the controller attaches the second padding data to the compressed write data.

3. The storage device according to claim 1, wherein
the controller is further configured to shift bits of the group of the compressed write data and one of the first and second padding data, and
the shifted group is encoded to generate the coded data.

4. The storage device according to claim 1, wherein
the controller writes two bits of data in each memory cell of a region of the nonvolatile memory, and
the logical page positions consist of the lower page position and the upper page position when the controller writes data in the region.

5. The storage device according to claim 1, wherein
the controller writes three bits of data in each memory cell of a region of the nonvolatile memory, and
the logical page positions consist of the lower page position, a middle page position, and the upper page position when the controller writes data in the region.

6. The storage device according to claim 1, wherein the controller is configured to, when performing the write operation:
   upon determining that the logical page position is the lower page, determine that each bit of the coded data is to be inverted if the number of "0" bits in the coded data is greater than the number of "1" bits in the coded data; and upon determining that the logical page position is the upper page, determine that each bit of the coded data is to be inverted if the number of "1" bits in the coded data is greater than the number of "0" bits in the coded data.

7. A storage device comprising:

a nonvolatile memory; and a controller configured to perform read and write operations on the nonvolatile memory, wherein the controller is configured to, when performing the write operation:

compress write data, attach one of first padding data of which values are all "0" and second padding data of which values are all "1", based on which of the "0" or "1" bit values are more populated in the compressed write data, process a group of the compressed write data and one of the first and second padding data to generate an error correction code, determine whether or not to invert each bit of the write data, based on a logical page position of the nonvolatile memory in which the write data are to be written and the number of "0" bits in the write data relative to the number of "1" bits, the logical page position being one of logical page positions including a lower page and an upper page, invert each bit of the write data upon determining to invert, and write a group of non-inverted write data or the inverted write data and the error correction code into the logical page position of the nonvolatile memory, and wherein the controller is configured to, when performing the read operation:

read the group of the non-inverted or inverted write data and the error correction code from the logical page position of the nonvolatile memory, carry out decoding of the write data included in the read group using the read error correction code, invert each bit of the write data included in the read group when the decoding fails, and carry out decoding of the inverted write data.

8. The storage device according to claim 7, wherein when the "0" bit values are more populated in the compressed write data than the "1" bit values, the controller attaches the first padding data to the compressed write data, and when the "1" bit values are more populated in the compressed write data than the "0" bit values, the controller attaches the second padding data to the compressed write data.

9. The storage device according to claim 7, wherein the controller is further configured to shift bits of the group of the compressed write data and one of the first and second padding data, and the shifted group is processed to generate the error correction code.

10. The storage device according to claim 7, wherein the controller writes two bits of data in each memory cell of a region of the nonvolatile memory, and the logical page positions consist of the lower page position and the upper page position when the controller writes data in the region.

11. The storage device according to claim 7, wherein the controller writes three bits of data in each memory cell of a region of the nonvolatile memory, and the logical page positions consist of the lower page position, a middle page position, and the upper page position when the controller writes data in the region.

12. The storage device according to claim 7, wherein the controller is configured to, when performing the write operation:

upon determining that the logical page position is the lower page, determine that each bit of the write data is to be inverted if the number of "0" bits in the write data is greater than the number of "1" bits in the write data; and upon determining that the logical page position is the upper page, determine that each bit of the coded data is to be inverted if the number of "1" bits in the write data is greater than the number of "0" bits in the write data.

13. A method of performing data operations on a nonvolatile memory, comprising:

performing a write operation by:

compressing write data;

attaching one of first padding data of which values are all "0" and second padding data of which values are all "1", based on which of the "0" or "1" bit values are more populated in the compressed write data; and encoding a group of the compressed write data and one of the first and second padding data to generate coded data, generating an error correction code from the write data;

determining whether or not to invert each bit of the coded data, based on a logical page position of the nonvolatile memory in which the write data are to be written and the number of "0" bits in the coded data relative to the number of "1" bits, the logical page position being one of logical page positions including a lower page and an upper page;

inverting each bit of the coded data upon determining to invert; and writing non-inverted coded data or the inverted coded data into the logical page position of the nonvolatile memory, and performing a read operation by:

reading the coded data from the logical page position of the nonvolatile memory; enter carrying out decoding of the read data;

inverting each bit of the read data when the decoding fails; and enter carrying out decoding of the inverted read data.

14. The method according to claim 13, wherein when the "0" bit values are more populated in the compressed write data than the "1" bit values, the first padding data are attached to the compressed write data, and when the "1" bit values are more populated in the compressed write data than the "0" bit values, the second padding data are attached to the compressed write data.

15. The method according to claim 13, further comprising:

shifting bits of the group of the compressed write data and one of the first and second padding data, the shifted group being encoded to generate the coded data.

16. The method according to claim 13, wherein two bits of data are written in each memory cell of a region of the nonvolatile memory, and the logical page positions consist of the lower page position and the upper page position when data are written in the region.

17. The method according to claim 13, wherein said performing the write operation further includes:

upon determining that the logical page position is the lower page, determining that each bit of the coded data is to be inverted if the number of "0" bits in the coded data is greater than the number of "1" bits in the coded data; and upon determining that the logical page position is the upper page, determining that each bit of the coded data is to be inverted if the number of "1" bits in the coded data is greater than the number of "0" bits in the coded data.

* * * * *